US008466509B2

(12) United States Patent
Yamada

(10) Patent No.: US 8,466,509 B2
(45) Date of Patent: Jun. 18, 2013

(54) SEMICONDUCTOR DEVICE HAVING A CONTACT PLUG CONNECTING TO A SILICIDE FILM FORMED ON A DIFFUSION REGION OF A FLASH MEMORY CELL

(75) Inventor: Tetsuya Yamada, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 115 days.

(21) Appl. No.: 12/013,709

(22) Filed: Jan. 14, 2008

(65) Prior Publication Data

US 2008/0203465 A1 Aug. 28, 2008

(30) Foreign Application Priority Data

Feb. 22, 2007 (JP) .................................. 2007-042924

(51) Int. Cl.
*H01L 29/788* (2006.01)
(52) U.S. Cl.
USPC ........... 257/326; 257/314; 257/382; 257/384; 257/E27.102
(58) Field of Classification Search
USPC .................. 257/316, 396, 315, 326, 382, 384
See application file for complete search history.

(56) References Cited

U.S. PATENT DOCUMENTS

| 5,079,603 | A | * | 1/1992 | Komori et al. ................. 257/316 |
| 6,177,314 | B1 | | 1/2001 | Van Der Meer et al. |
| 6,265,739 | B1 | * | 7/2001 | Yaegashi et al. .............. 257/296 |
| 6,287,907 | B1 | | 9/2001 | Ito et al. |
| 6,342,715 | B1 | * | 1/2002 | Shimizu et al. ................ 257/314 |
| 6,534,355 | B2 | | 3/2003 | Ito et al. |
| 6,569,742 | B1 | * | 5/2003 | Taniguchi et al. ............ 438/303 |
| 7,151,295 | B2 | * | 12/2006 | Yaegashi et al. .............. 257/316 |
| 7,309,891 | B2 | | 12/2007 | Yaegashi et al. |
| 7,687,346 | B2 | | 3/2010 | Yaegashi et al. |
| 7,977,728 | B2 | | 7/2011 | Yaegashi et al. |
| 2002/0132416 | A1 | | 9/2002 | Gamo et al. |
| 2003/0181009 | A1 | | 9/2003 | Nakagawa |
| 2005/0083744 | A1 | | 4/2005 | Arai et al. |
| 2005/0258463 | A1 | | 11/2005 | Yaegashi et al. |
| 2006/0099798 | A1 | * | 5/2006 | Nakagawa .................... 438/622 |
| 2011/0248329 | A1 | | 10/2011 | Yaegashi et al. |
| 2011/0248330 | A1 | | 10/2011 | Yaegashi et al. |

FOREIGN PATENT DOCUMENTS

| EP | 1 005 081 A2 | 5/2000 |
| JP | 2001-284469 A | 10/2001 |
| JP | 2002280464 A | 9/2002 |
| JP | 2003282740 A | 10/2003 |
| JP | 2005-116970 A | 4/2005 |
| JP | 2006-060138 A | 3/2006 |
| KP | 2000-35655 A | 6/2000 |
| KP | 2001-71624 A | 7/2001 |

OTHER PUBLICATIONS

European Search Report dated Mar. 26, 2009, issued in corresponding European Patent Application No. 08100340.2.
Korean Office Action dated Oct. 16, 2009, issued in corresponding Korean Patent Application No. 10-2008-0007403.
Japanese Office Action dated May 1, 2012, issued in corresponding Japanese Patent Application No. 2007-042924, (7 pages).

\* cited by examiner

*Primary Examiner* — Anh Mai
(74) *Attorney, Agent, or Firm* — Westerman, Hattori, Daniels & Adrian, LLP

(57) ABSTRACT

The present invention provides a method for manufacturing a semiconductor device including the steps of forming a flash memory cell provided with a floating gate, an intermediate insulating film, and a control gate, forming first and second impurity diffusion regions, thermally oxidizing surfaces of a silicon substrate and the floating gate, etching a tunnel insulating film in a partial region through a window of a resist pattern; forming a metal silicide layer on the first impurity diffusion region in the partial region, forming an interlayer insulating film covering the flash memory cell, and forming, in a first hole of the interlayer insulating film, a conductive plug connected to the metal silicide layer.

6 Claims, 35 Drawing Sheets

At the time of writing

SEMICONDUCTOR DEVICE HAVING A CONTACT PLUG CONNECTING TO A SILICIDE FILM FORMED ON A DIFFUSION REGION OF A FLASH MEMORY CELL

CROSS-REFERENCE TO RELATED APPLICATIONS

This application is based on and claims priority of Japanese Patent Application No. 2007-042924 filed on Feb. 22, 2007, the entire contents of which are incorporated herein by reference.

TECHNICAL FIELD

It is related to a semiconductor device and a method for manufacturing the semiconductor device.

BACKGROUND

In a semiconductor device such as an LSI, an impurity diffusion region (e.g., a source/drain region) is formed in a surface layer of a semiconductor substrate, and a thermal oxidation film is formed on the impurity diffusion region as a gate insulating film. At this time, the growth rate of the thermal oxidation film tends to be faster as the impurity concentration of the impurity diffusion region becomes higher. Such a phenomenon is referred to as accelerating oxidation.

The concentration of the impurity diffusion region formed in the semiconductor substrate is optimized depending on a role that the impurity diffusion region plays. Thus, a plurality of impurity diffusion regions in one chip rarely have the same concentration. Normally, concentrations of the impurity diffusion regions are different from one another.

However, when the concentrations of the impurity diffusion regions are different from one another, the thermal oxidation film grows thicker in the impurity diffusion region with a high concentration than in other portions due to the above-described accelerating oxidation. The thermal oxidation film is needed to be removed by etching before a metal silicide layer is formed in the surface layer of the impurity diffusion region. However, when the etching time is adjusted for the thickly formed thermal oxidation film, the device isolation insulating films located below the thermal oxidation film are also etched in the portions where the thermal oxidation film is formed thinly.

For this reason, as shown in Japanese Patent Application Laid-open Publication No. 2003-282740 for example, a problem arises that a leak current increases in edge portions of an active region of a transistor.

In Japanese Patent Application Laid-open Publication No. 2003-282740, for the purpose of avoiding such a problem, a thermal oxidation film is covered by a silicon nitride film in order to prevent the thermal oxidation film under the silicon nitride film from being acceleratedly oxidized (see, paragraph 0040).

In addition, in Japanese Patent Application Laid-open Publication No. 2002-280464, a substance such as nitrogen having a function to prevent accelerating oxidation is ion-implanted into a semiconductor substrate (see paragraph 0060).

SUMMARY

It is an aspect of the embodiments discussed herein to provide a semiconductor device, including a semiconductor substrate, first and second impurity diffusion regions, which are formed at a distance from each other in a surface layer of the semiconductor substrate, a thermal oxidation film, which are formed on at least the first and second impurity diffusion regions and the semiconductor substrate therebetween, a flash memory cell, which is formed by laminating, a floating gate formed of a first conductive film, an intermediate insulating film, a control gate formed of a second conductive film in this order on the thermal oxidation film, and which uses the first and second impurity diffusion regions as source/drain regions, an interlayer insulating film, which covers the flash memory cell, and which is provided with a first hole over the first impurity diffusion region, and a first conductive plug formed in the first hole, wherein the thermal oxidation film is removed from a partial region of the first impurity diffusion region, a metal silicide film is formed on the partial region of the first impurity diffusion region, and the metal silicide layer and the conductive plug are connected.

It is another aspect of the embodiments discussed herein to provide a method for manufacturing a semiconductor device including the steps of forming a thermal oxidation film, a first conductive film, and an intermediate insulating film in this order over a semiconductor substrate, forming a second conductive film over the intermediate insulating film, forming a flash memory cell provided with a floating gate, the intermediate insulating film, and a control gate, by patterning the first conductive film, the intermediate insulating film, and the second conductive film, forming first and second impurity diffusion regions, which are to be source/drain regions of the flash memory cell, in portions of the semiconductor substrate beside the control gate, thermally oxidizing surfaces of each of the semiconductor substrate and the floating gate after the first and second impurity diffusion regions are formed, forming a resist pattern, provided with a window over a partial region of the first impurity diffusion region, over the thermal oxidation film and the flash memory cell after the thermal oxidation, removing the thermal oxidation film in the partial region by etching through the window, removing the resist pattern, forming a metal silicide layer on the partial region of the first impurity diffusion region, forming an interlayer insulating film covering the flash memory cell, forming a first hole in the interlayer insulating film over the partial region; and forming a conductive plug connected to the metal silicide layer in the first hole.

DETAILED DESCRIPTION OF THE PREFERRED EMBODIMENTS (1) Preliminary Explanation Prior to describing the preferred embodiments, preliminary explanation will be given below.

Figure 1A:
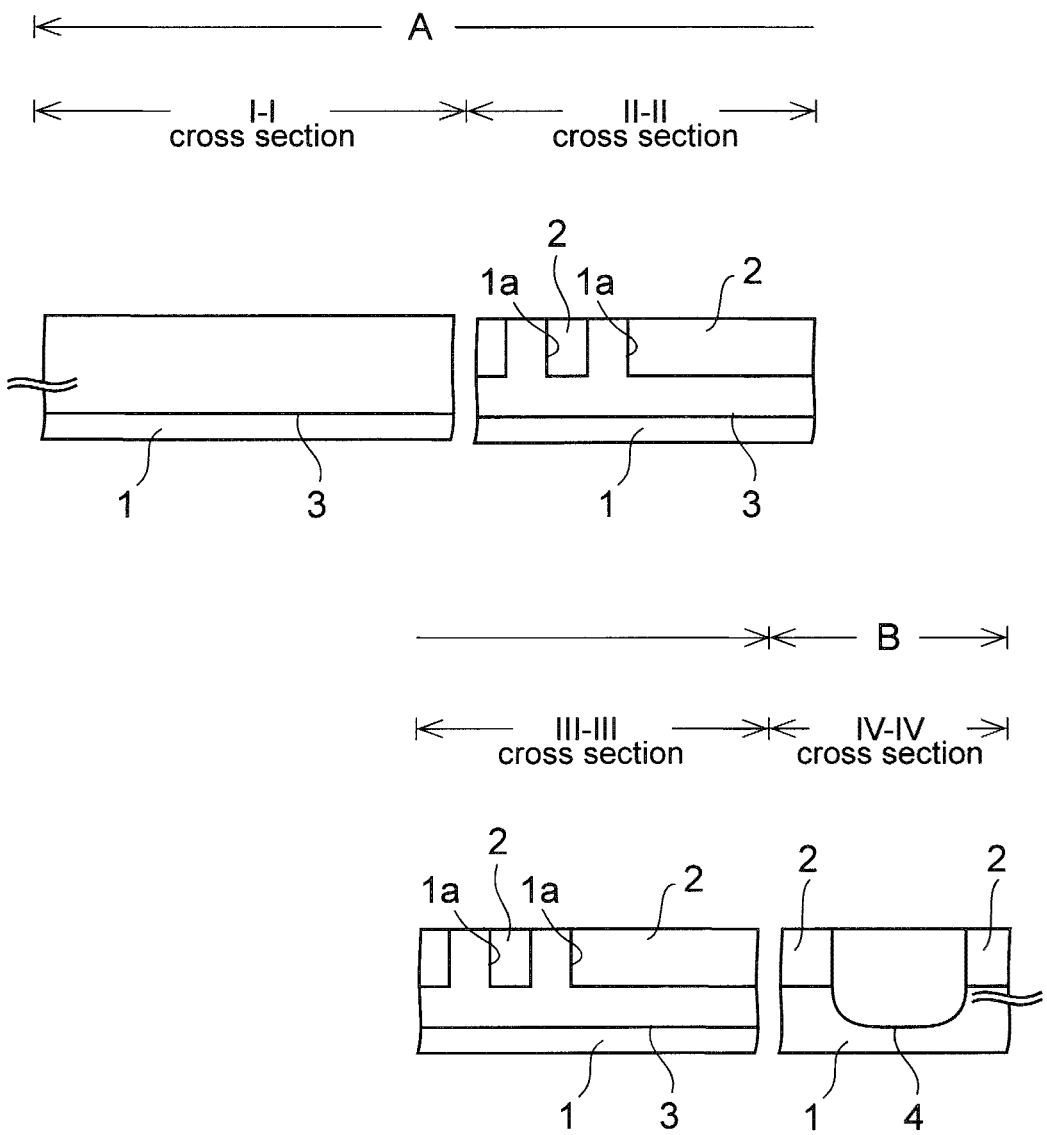
FIGS. 1A to 1V are cross-sectional views of a manufacturing semiconductor device according to a preliminary explanation.
Figure 1B:
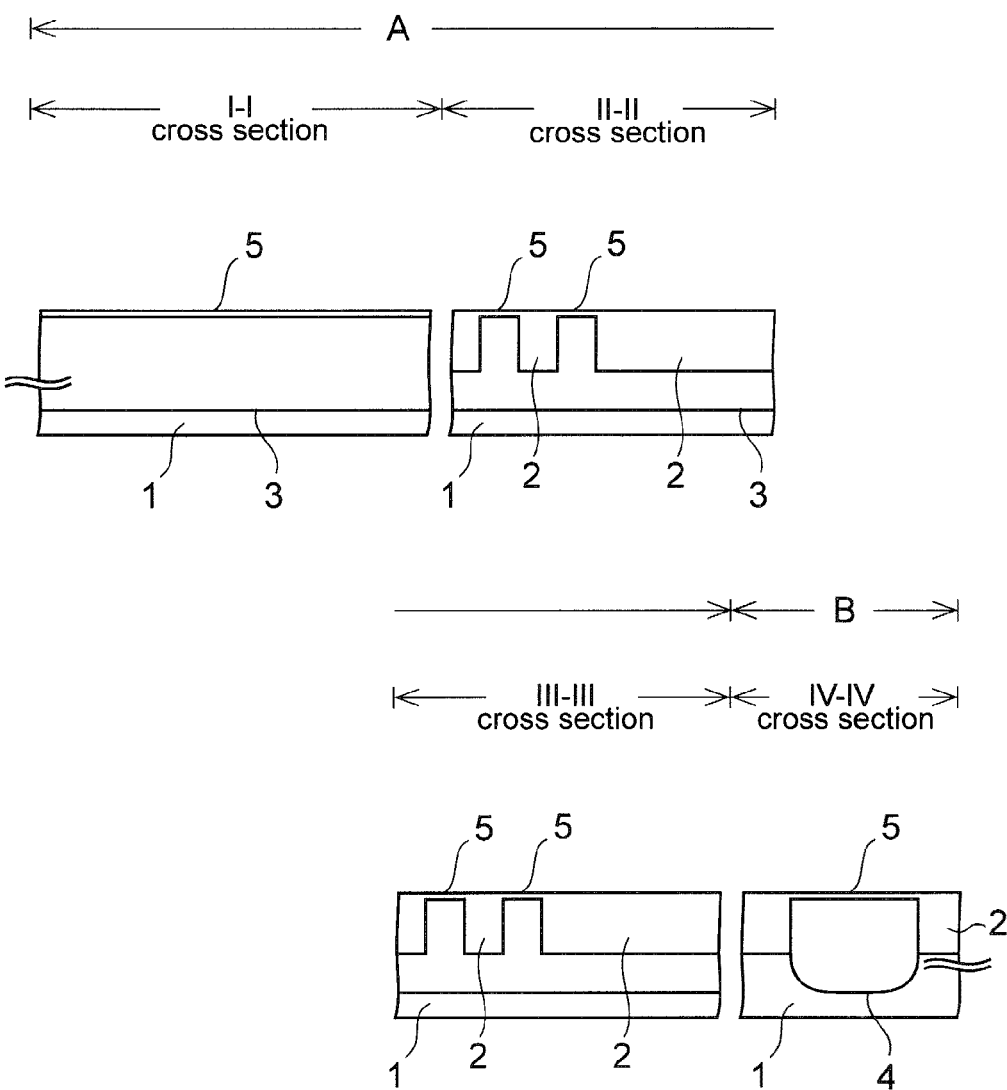
Figure 1C:
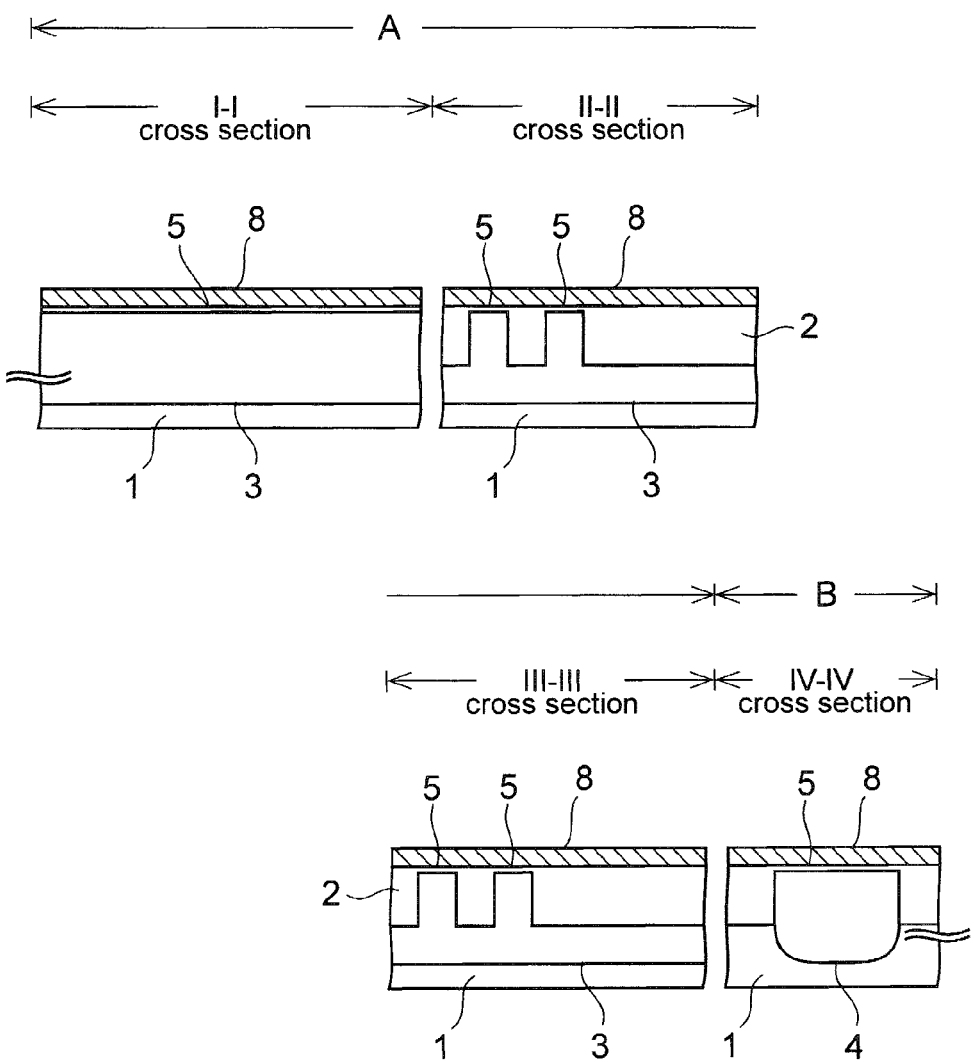
Figure 1D:
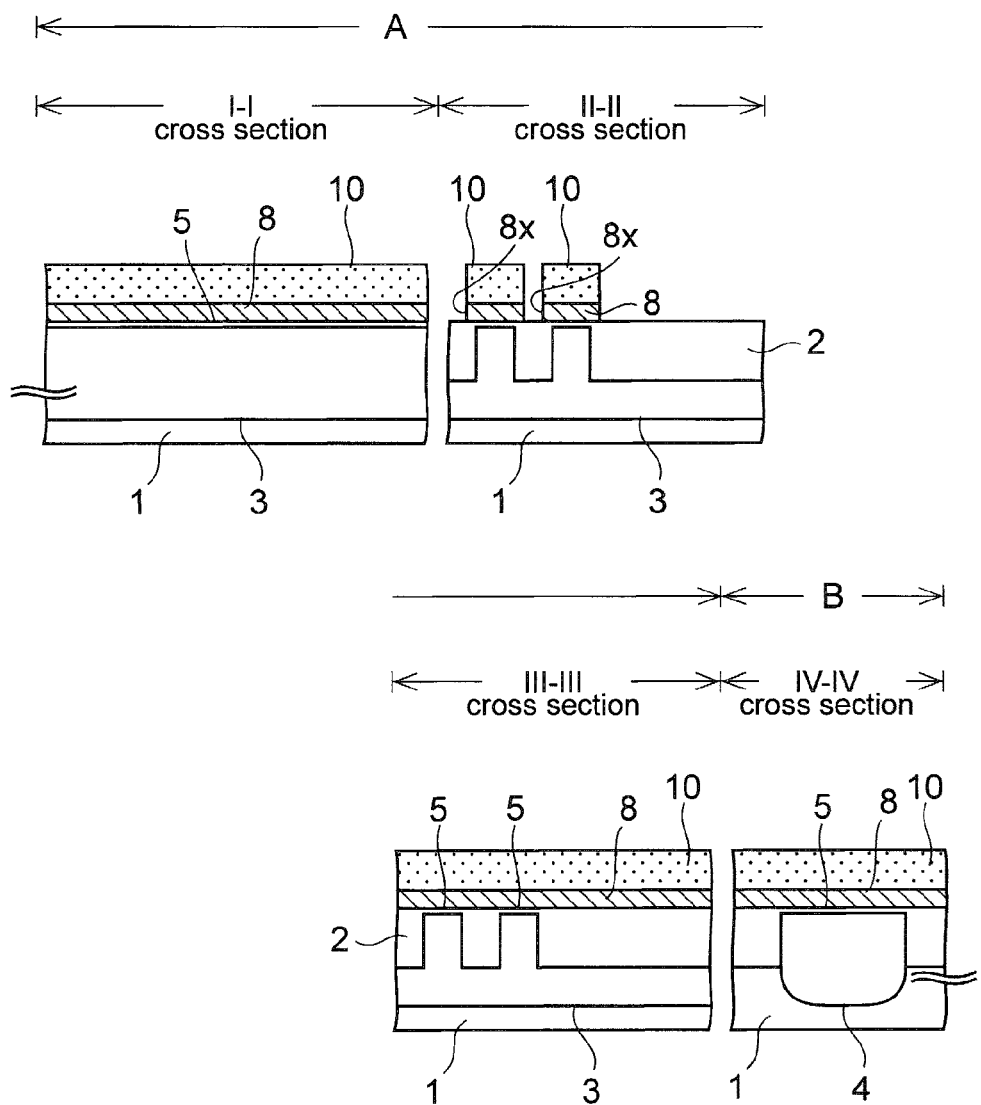
Figure 1E:
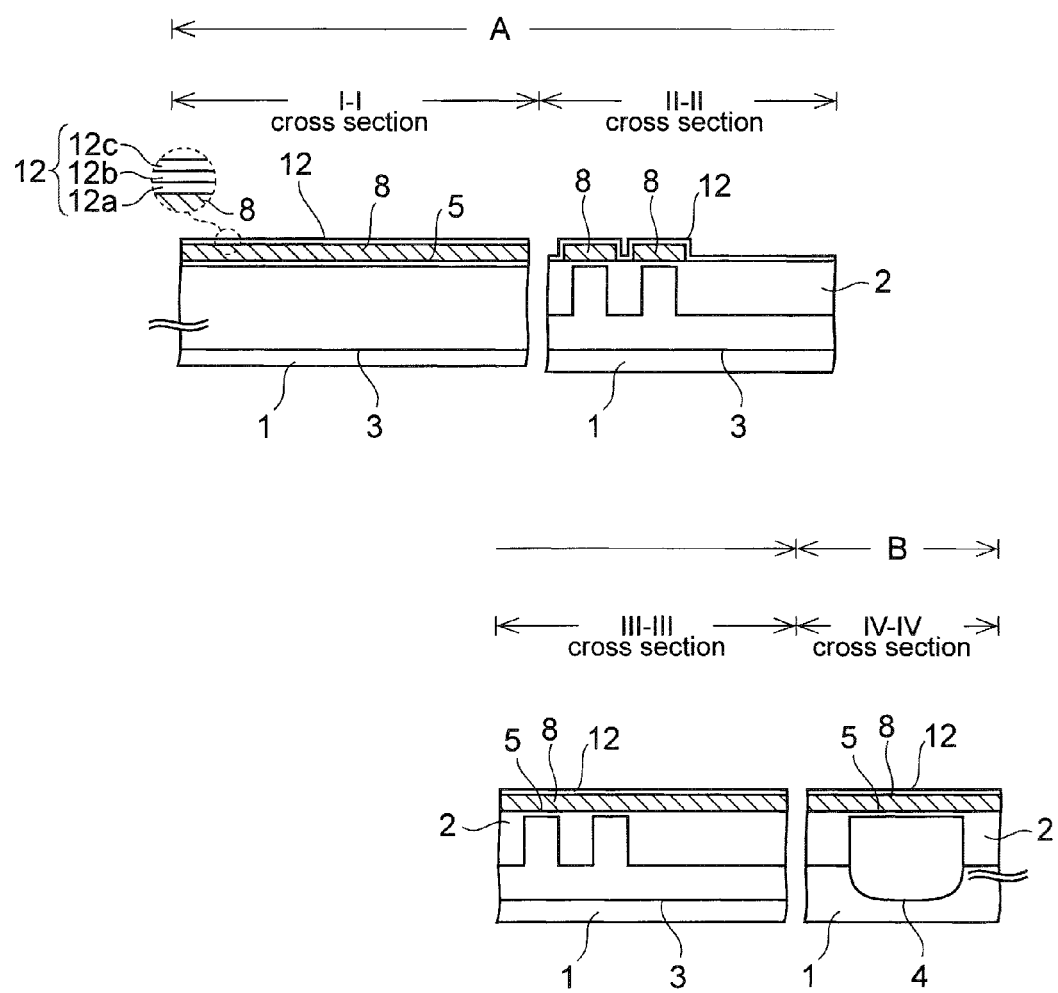
Figure 1F:
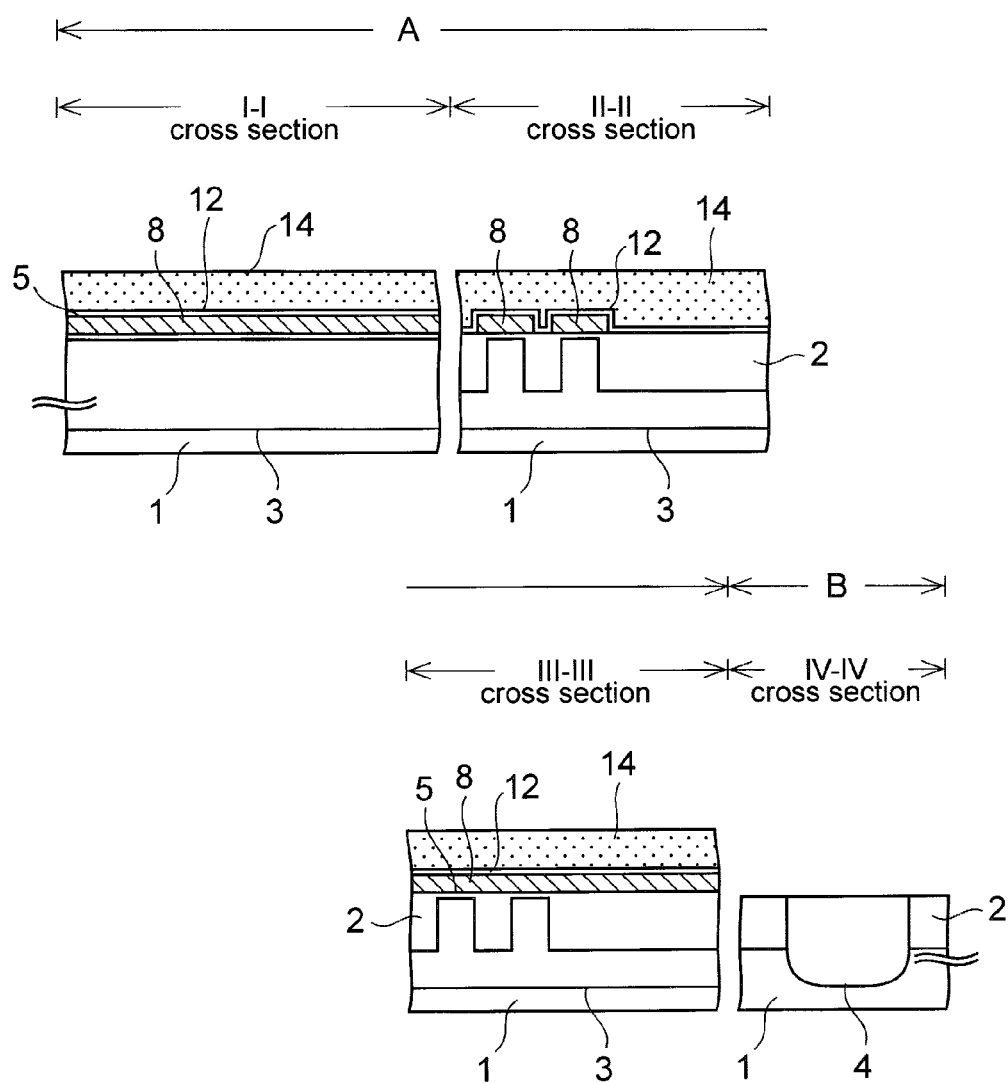
Figure 1G:
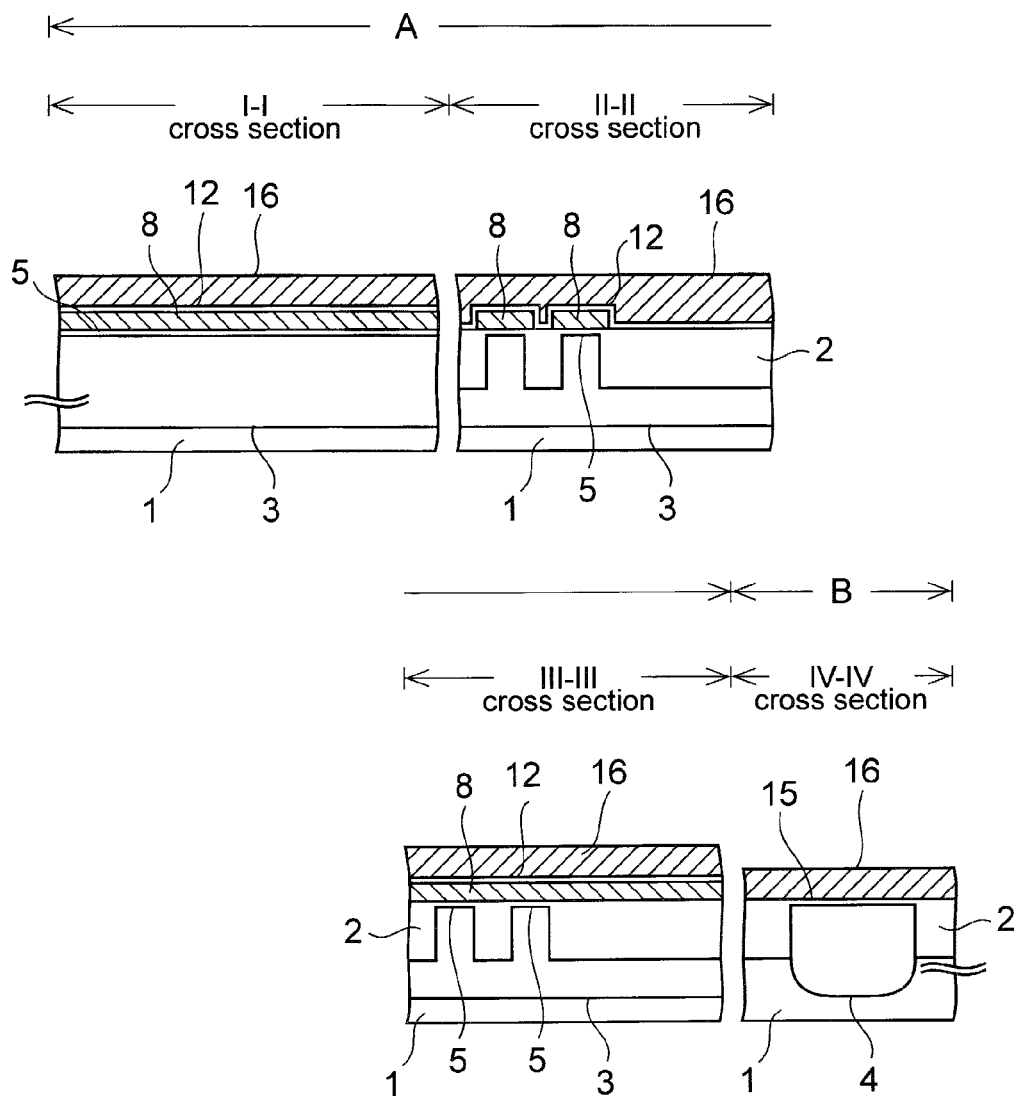
Figure 1H:
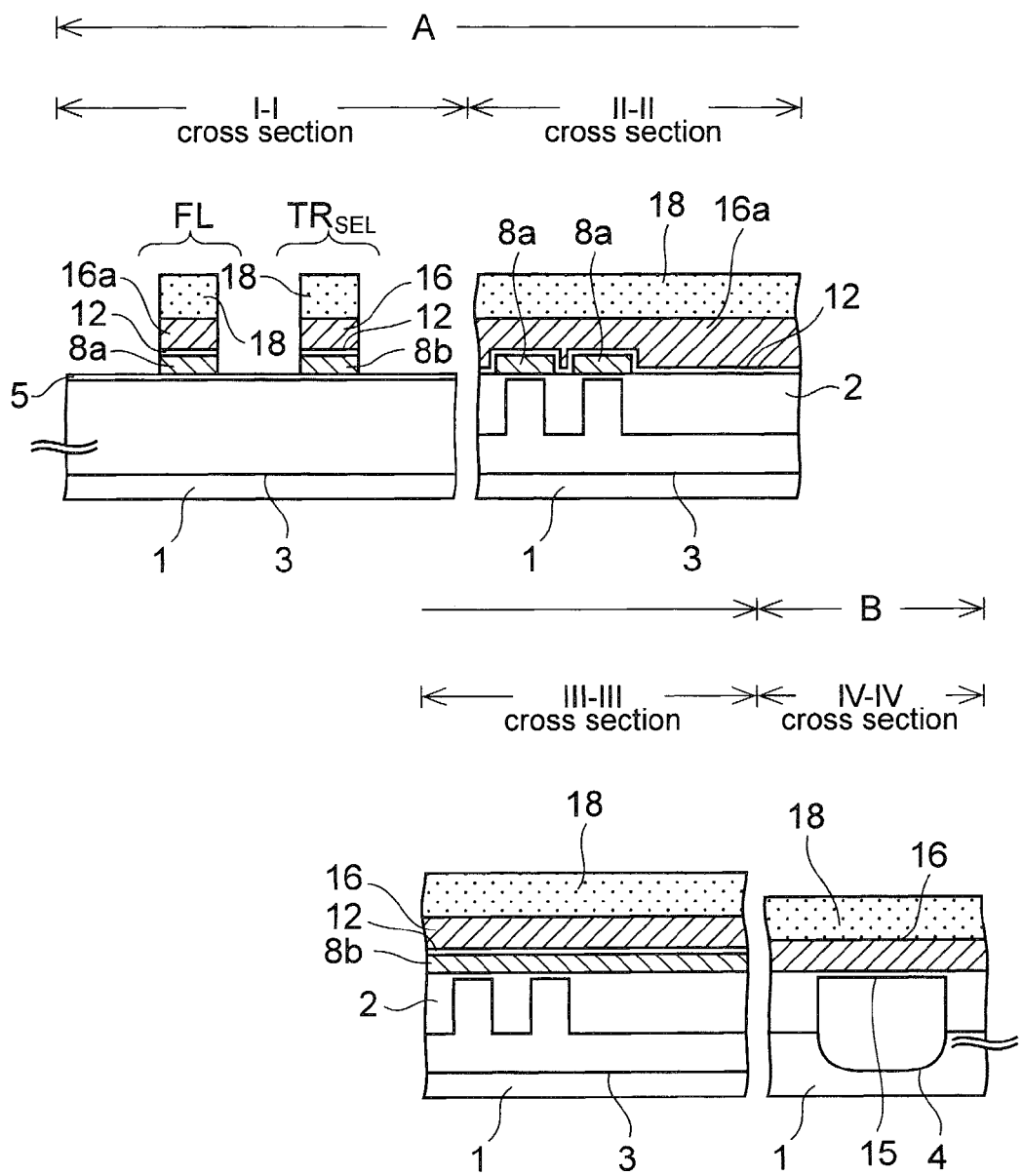
Figure 1I:
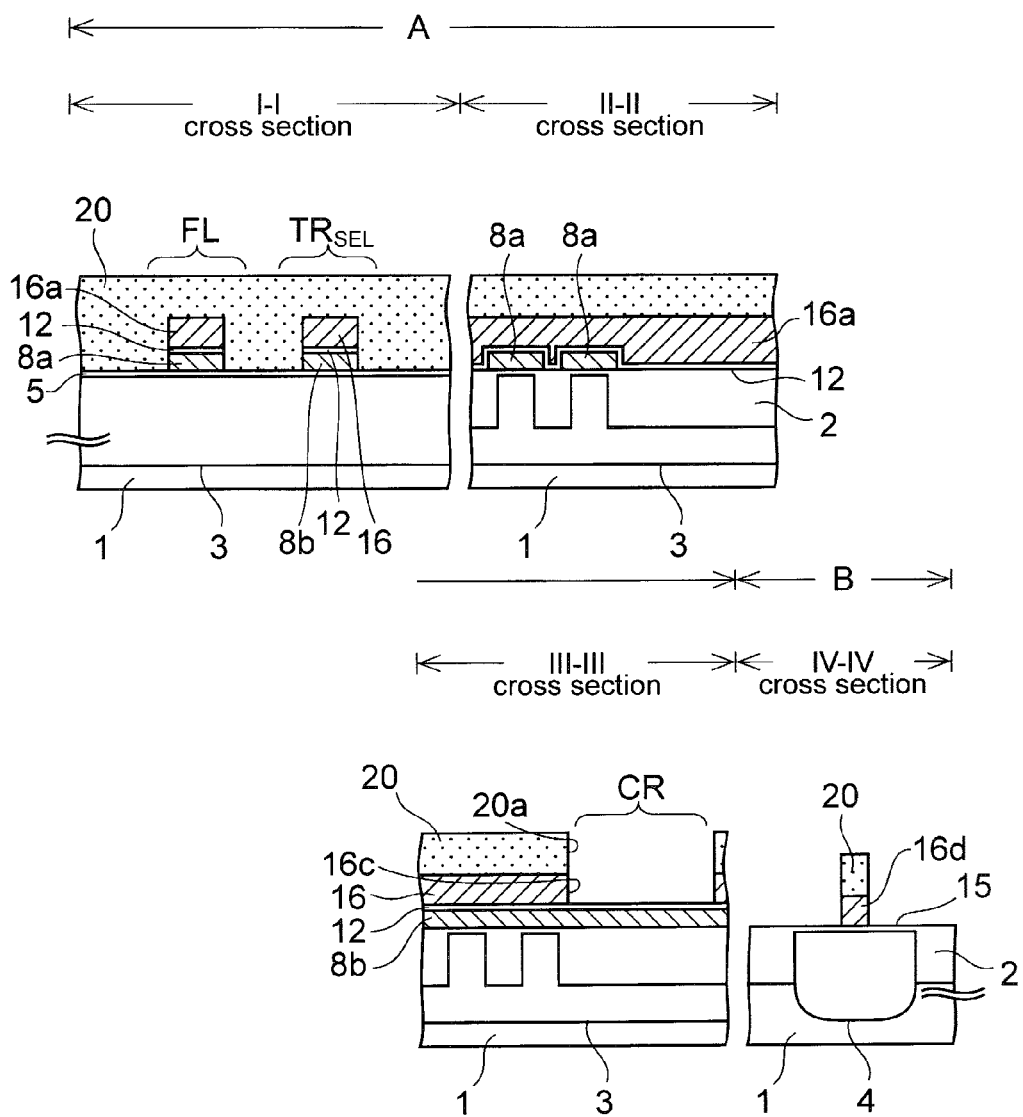
Figure 1J:
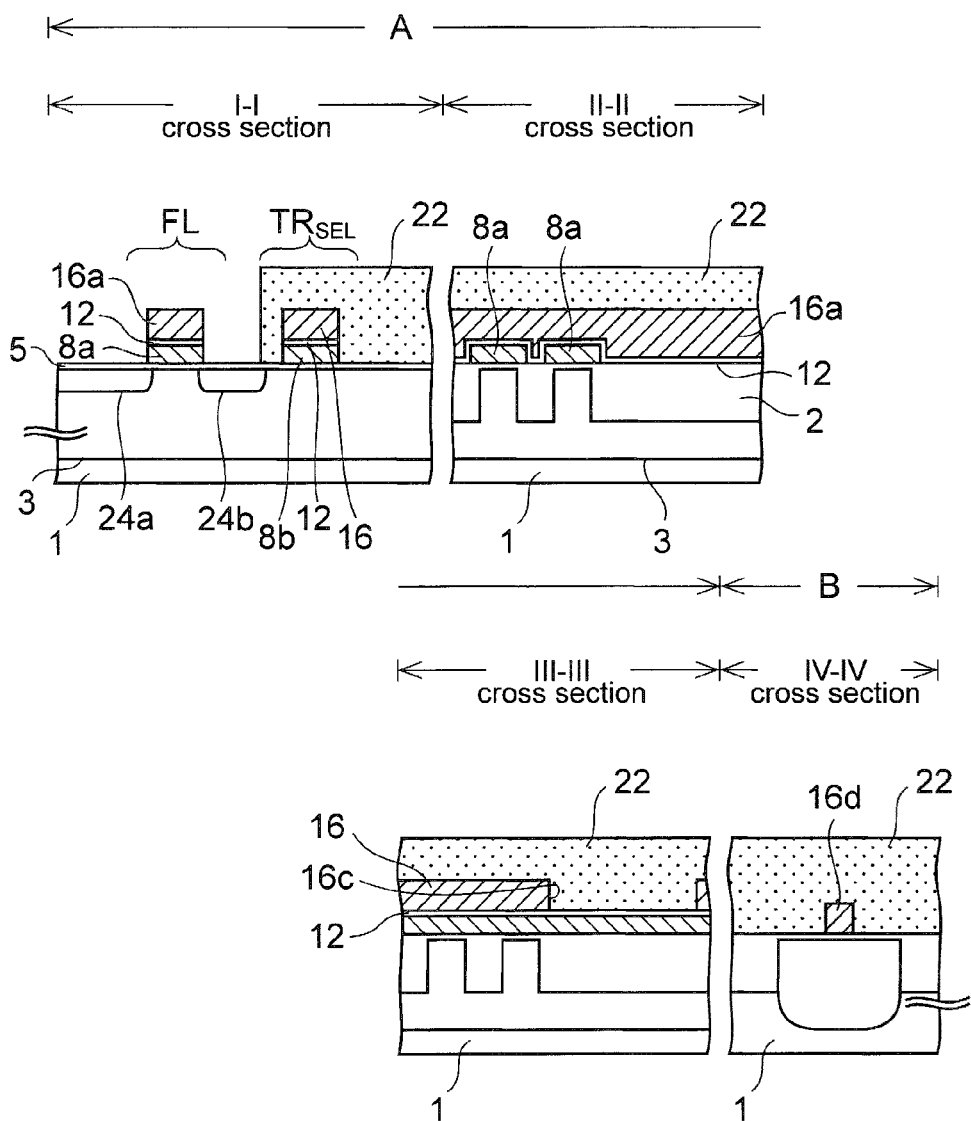
Figure 1K:
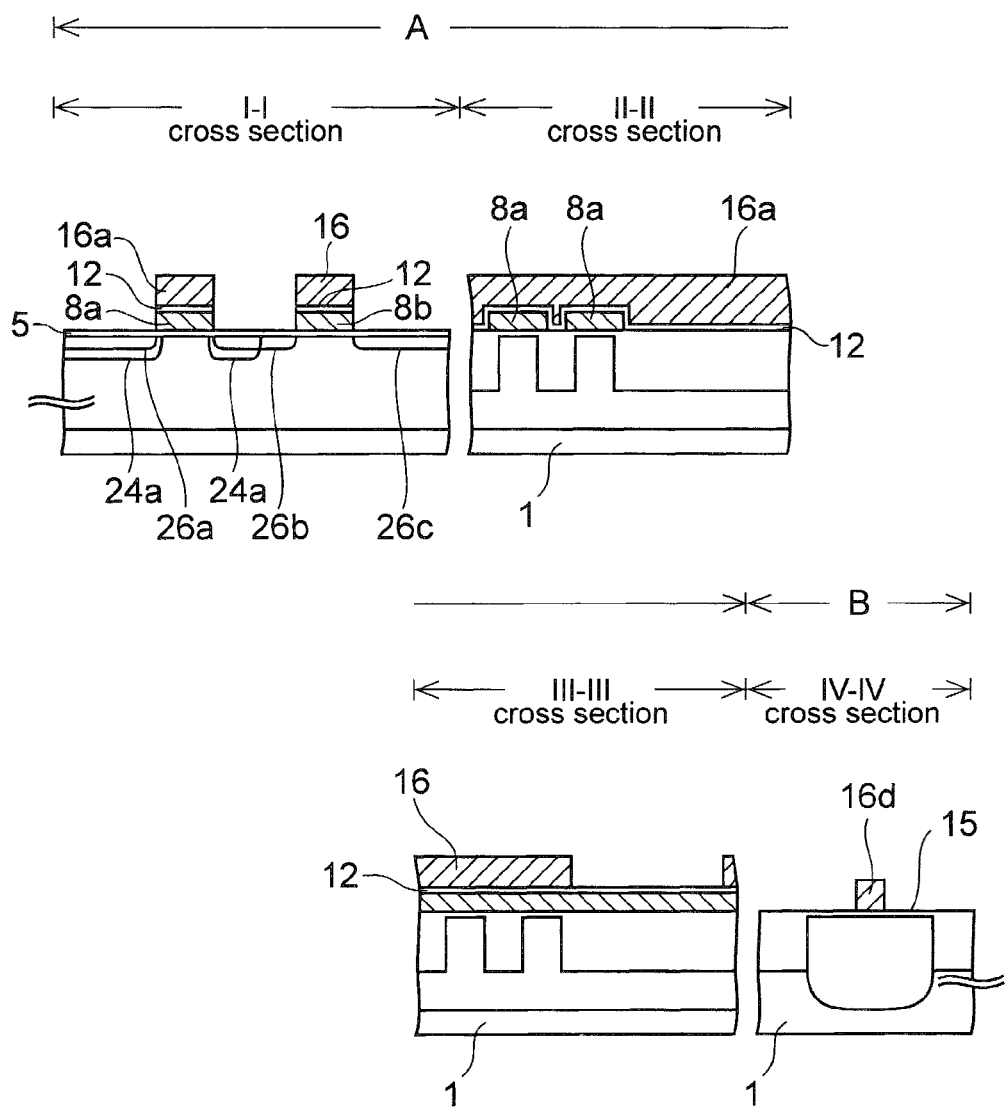
Figure 1L:
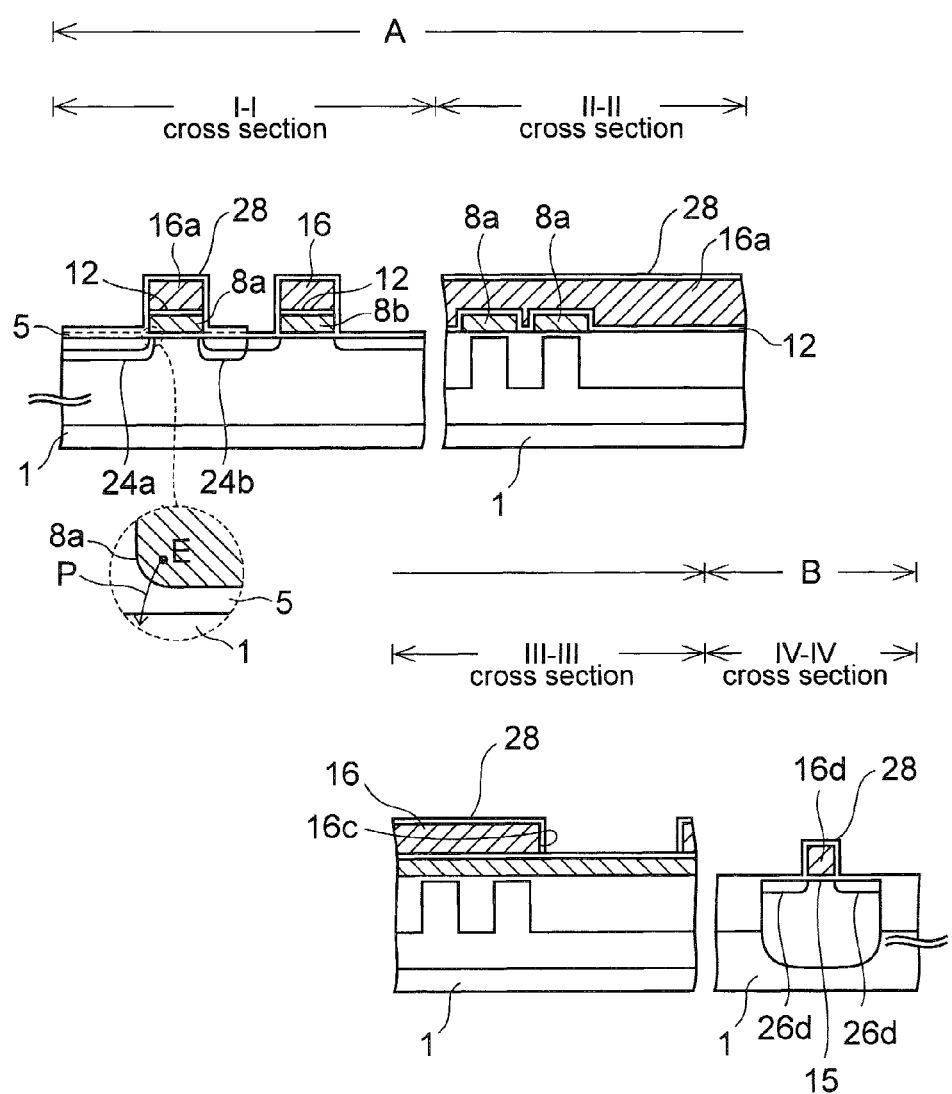
Figure 1M:
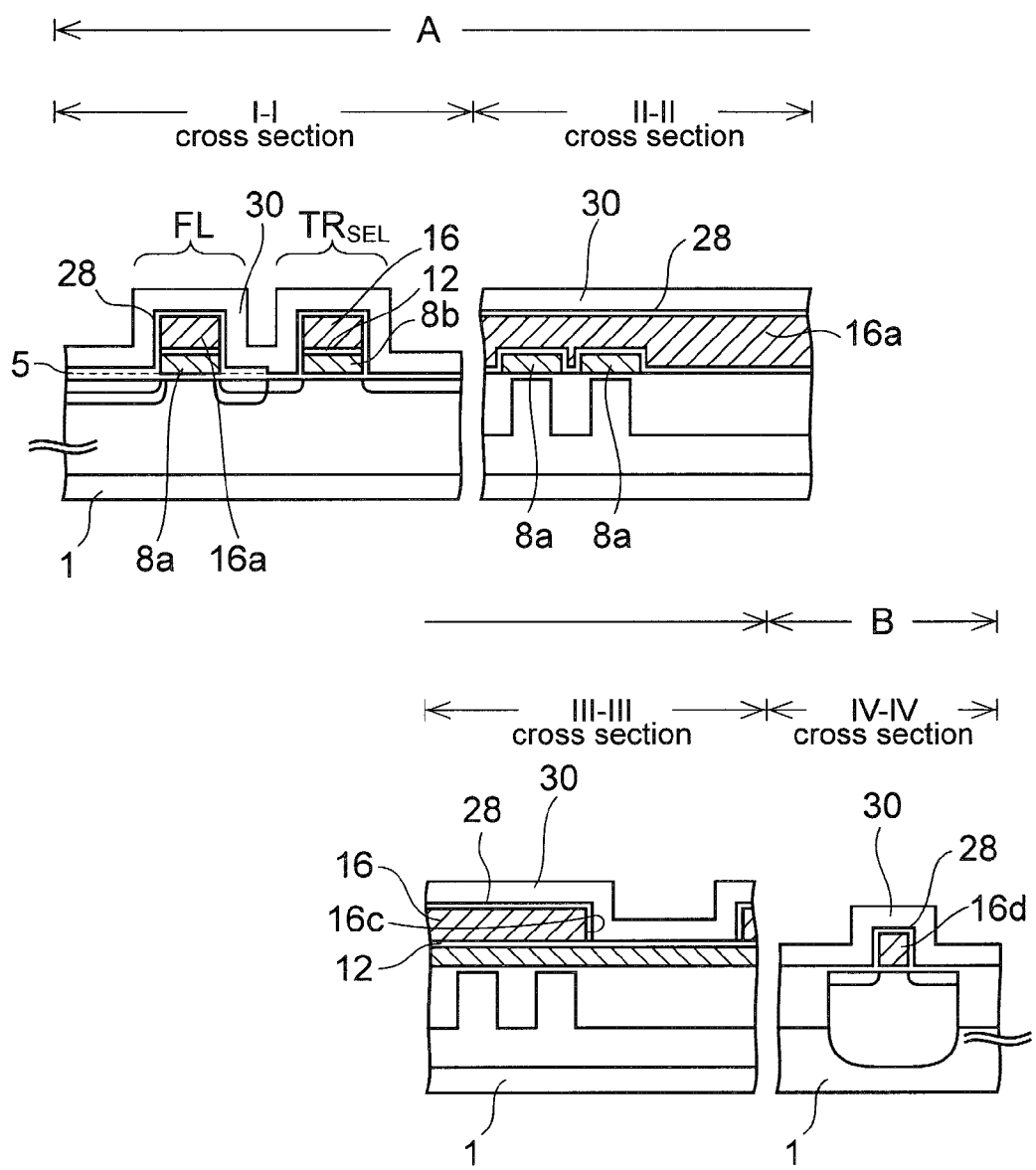
Figure 1N:
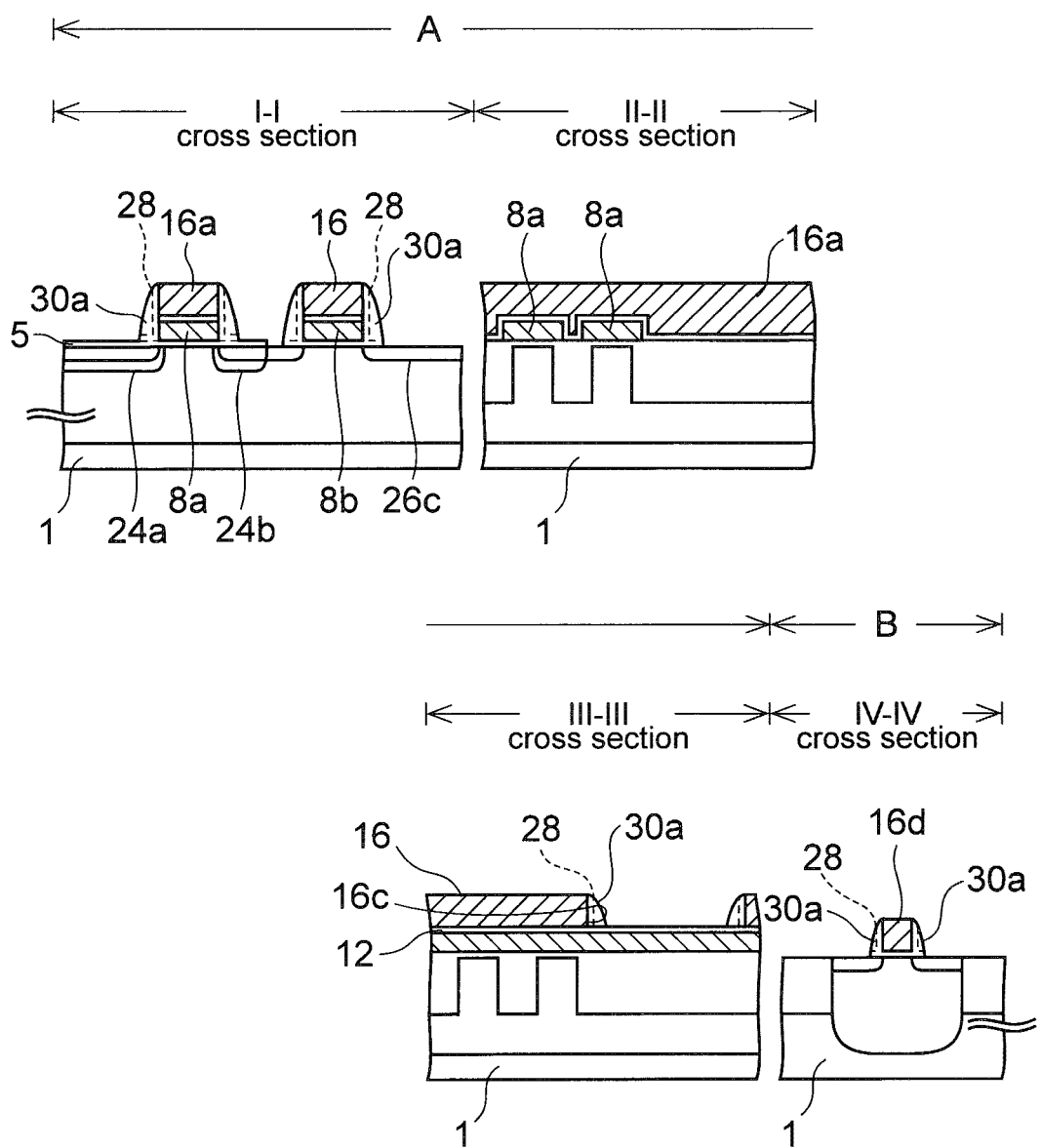
Figure 10:
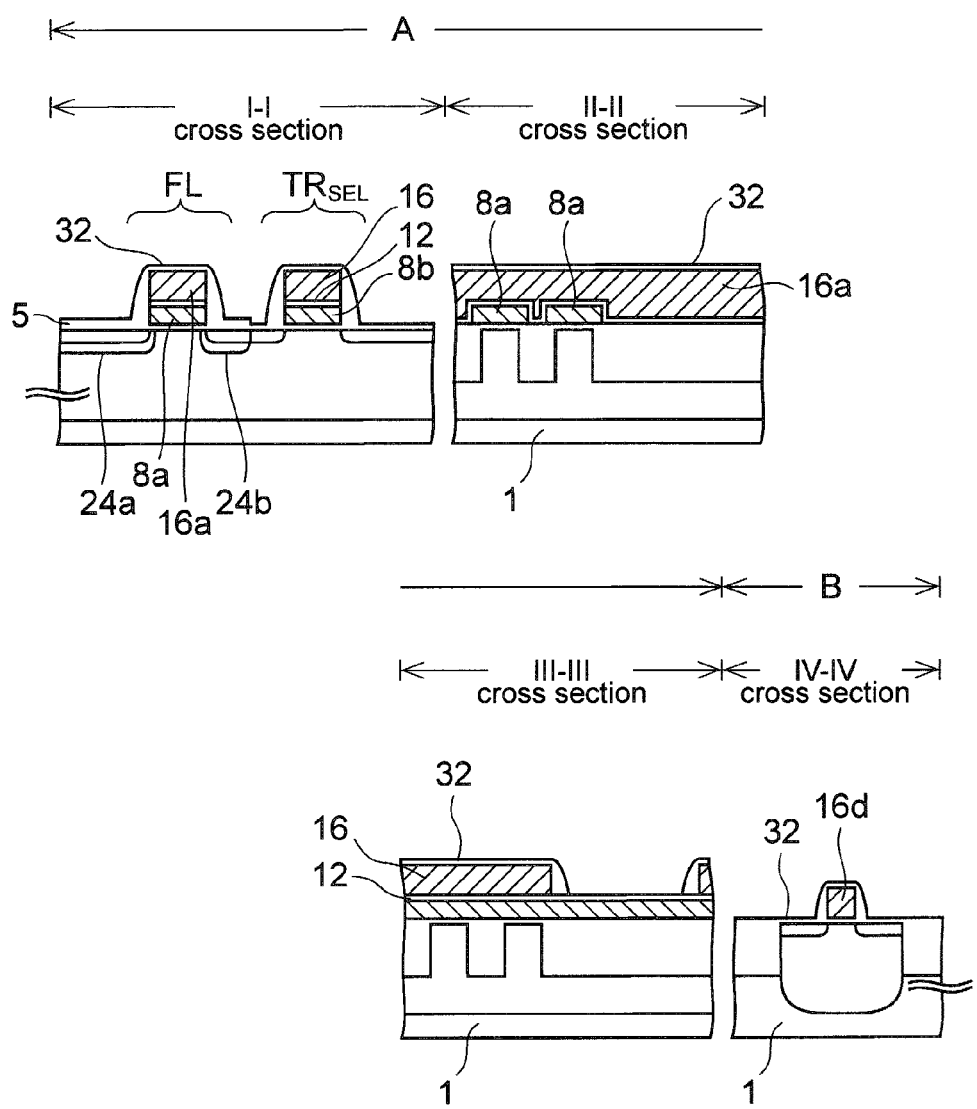
Figure 1P:
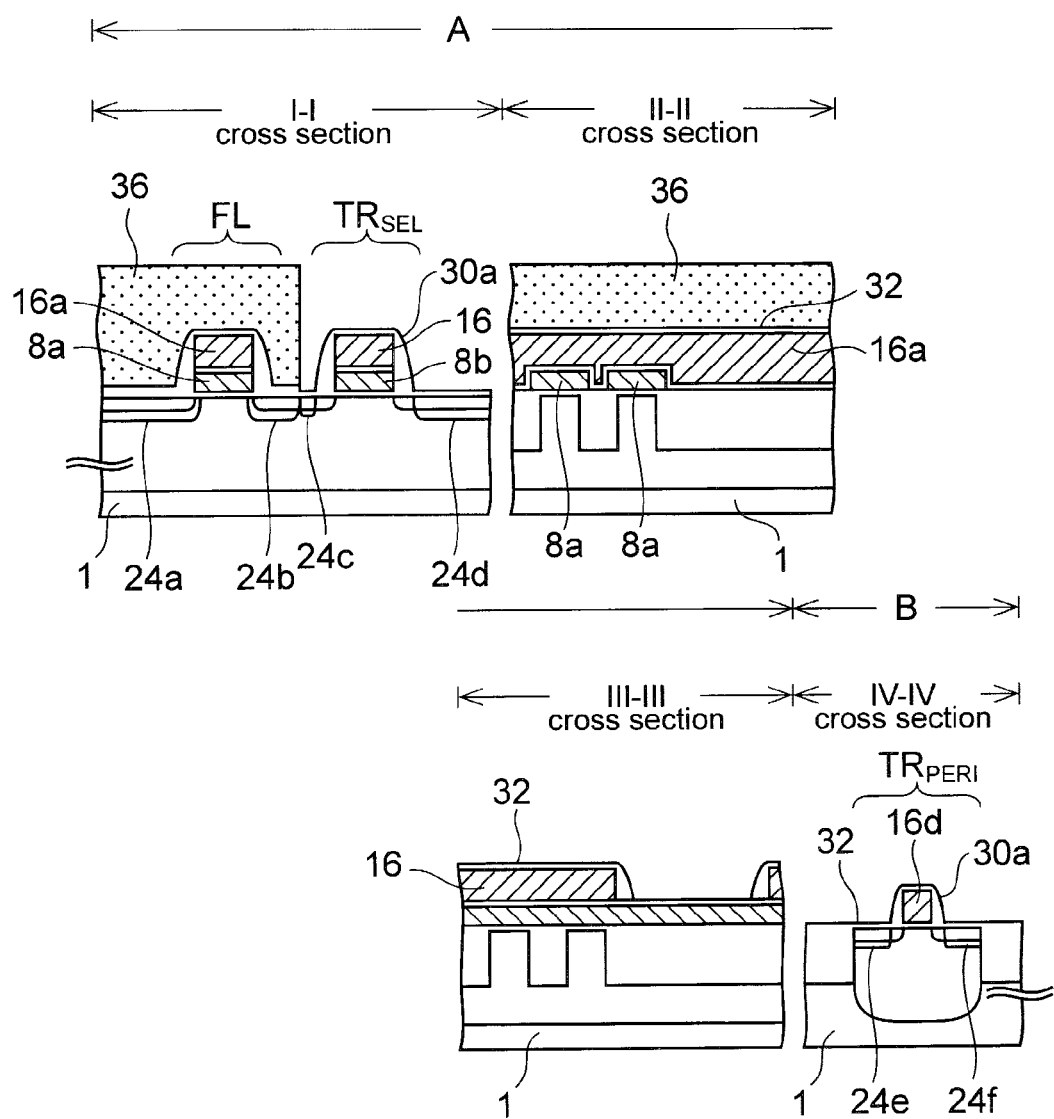
Figure 1Q:
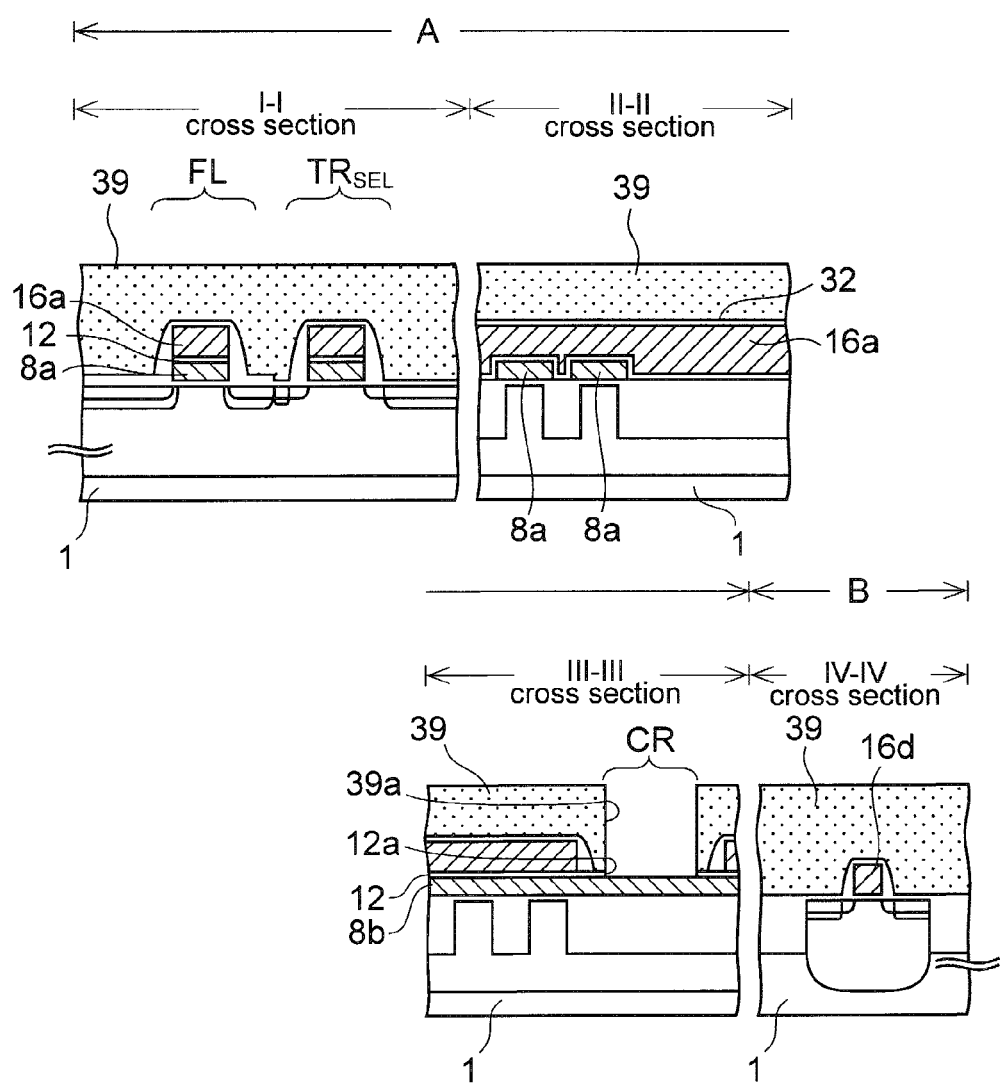
Figure 1R:
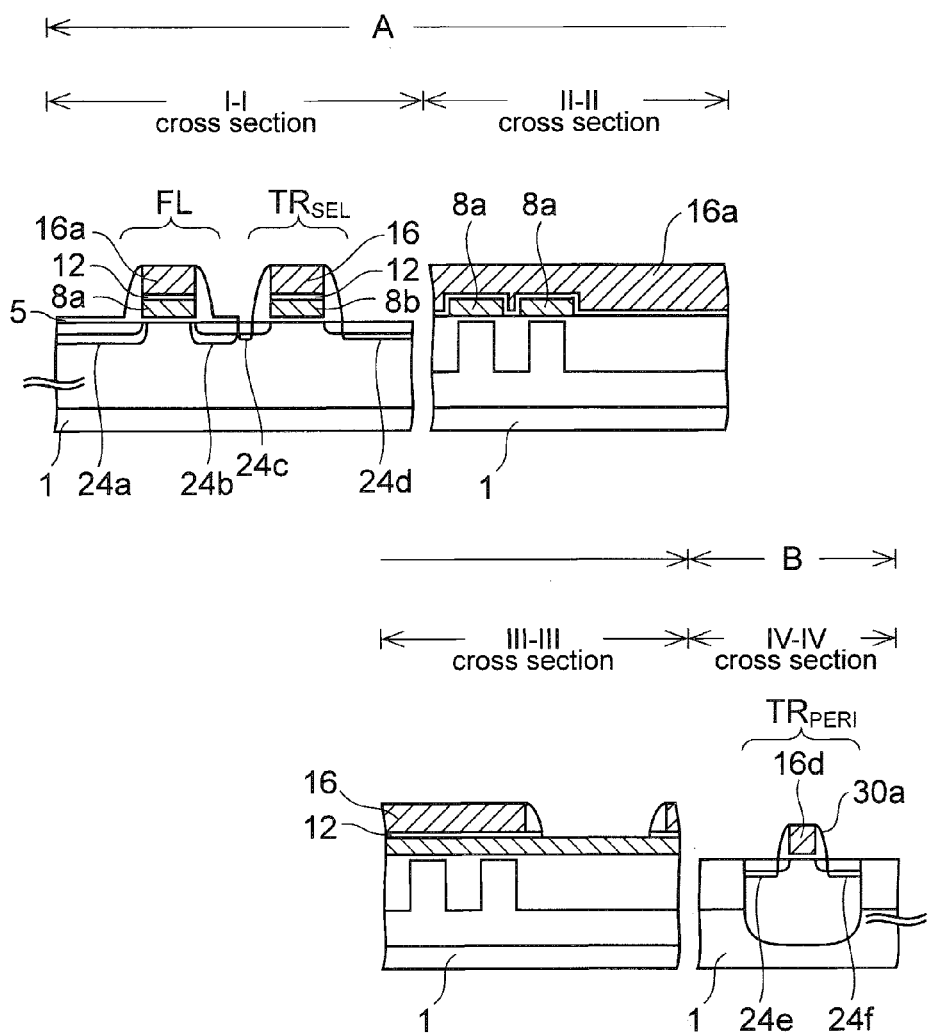
Figure 1S:
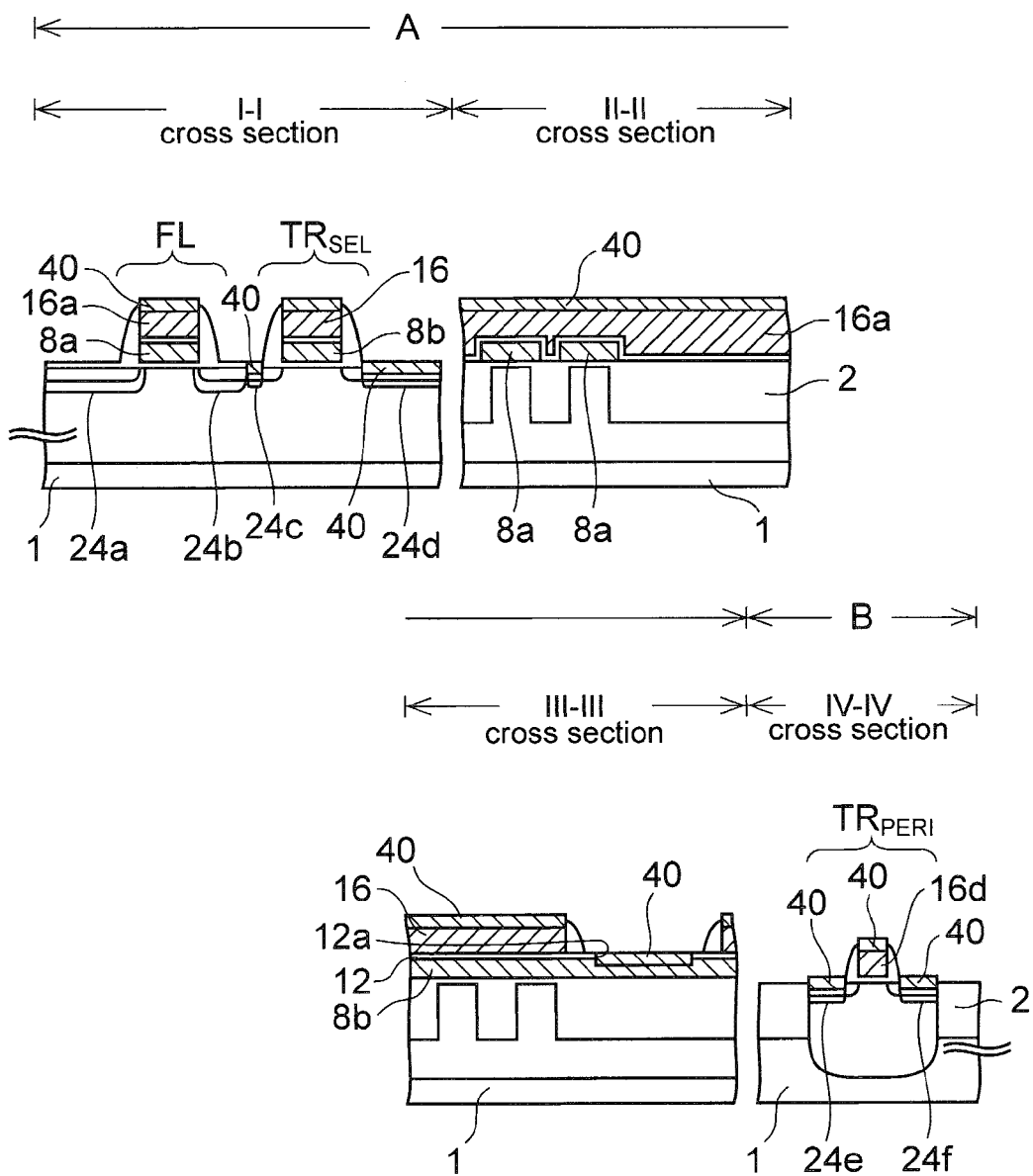
Figure 1T:
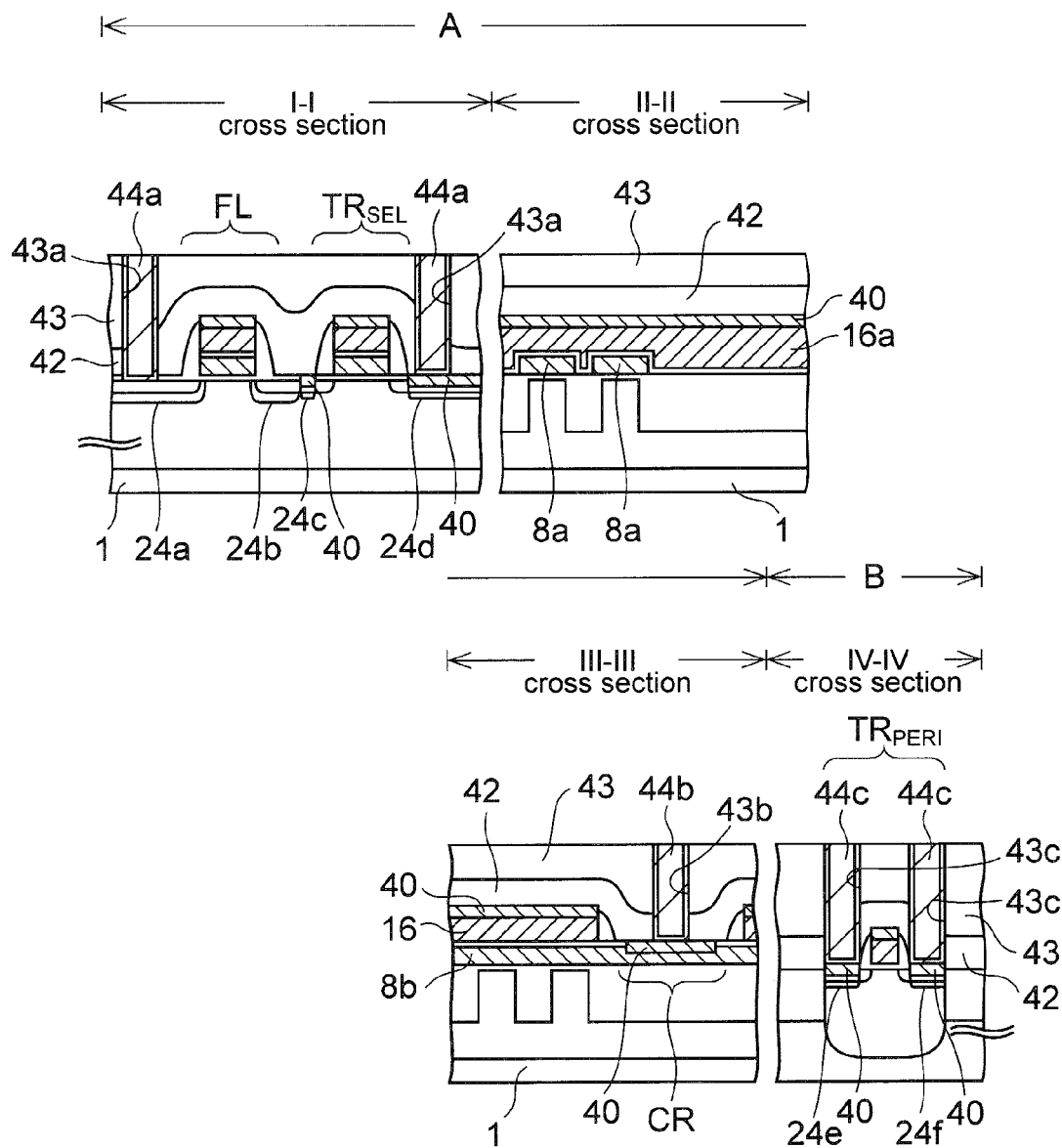
Figure 1U:
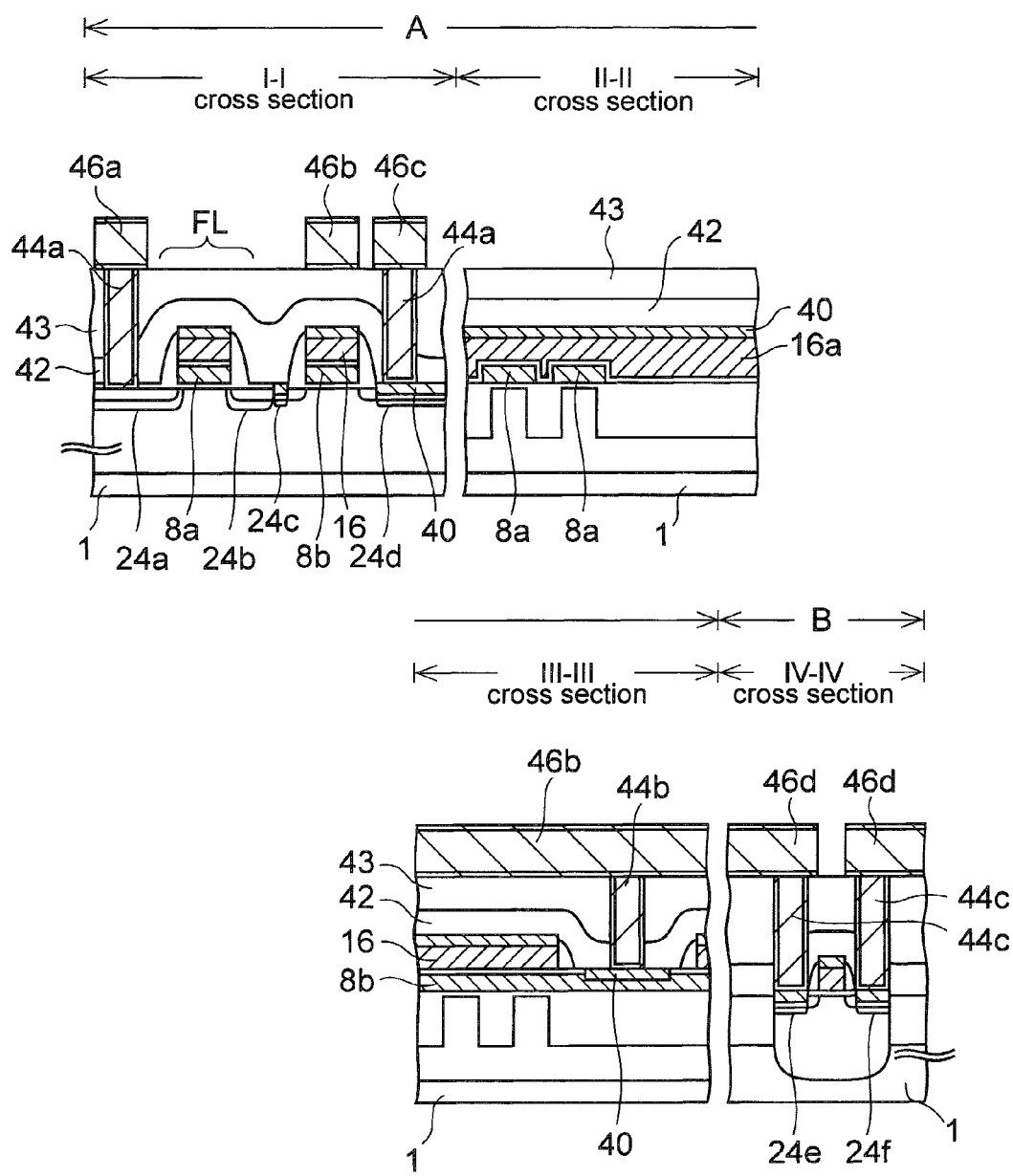
Figure 1V:
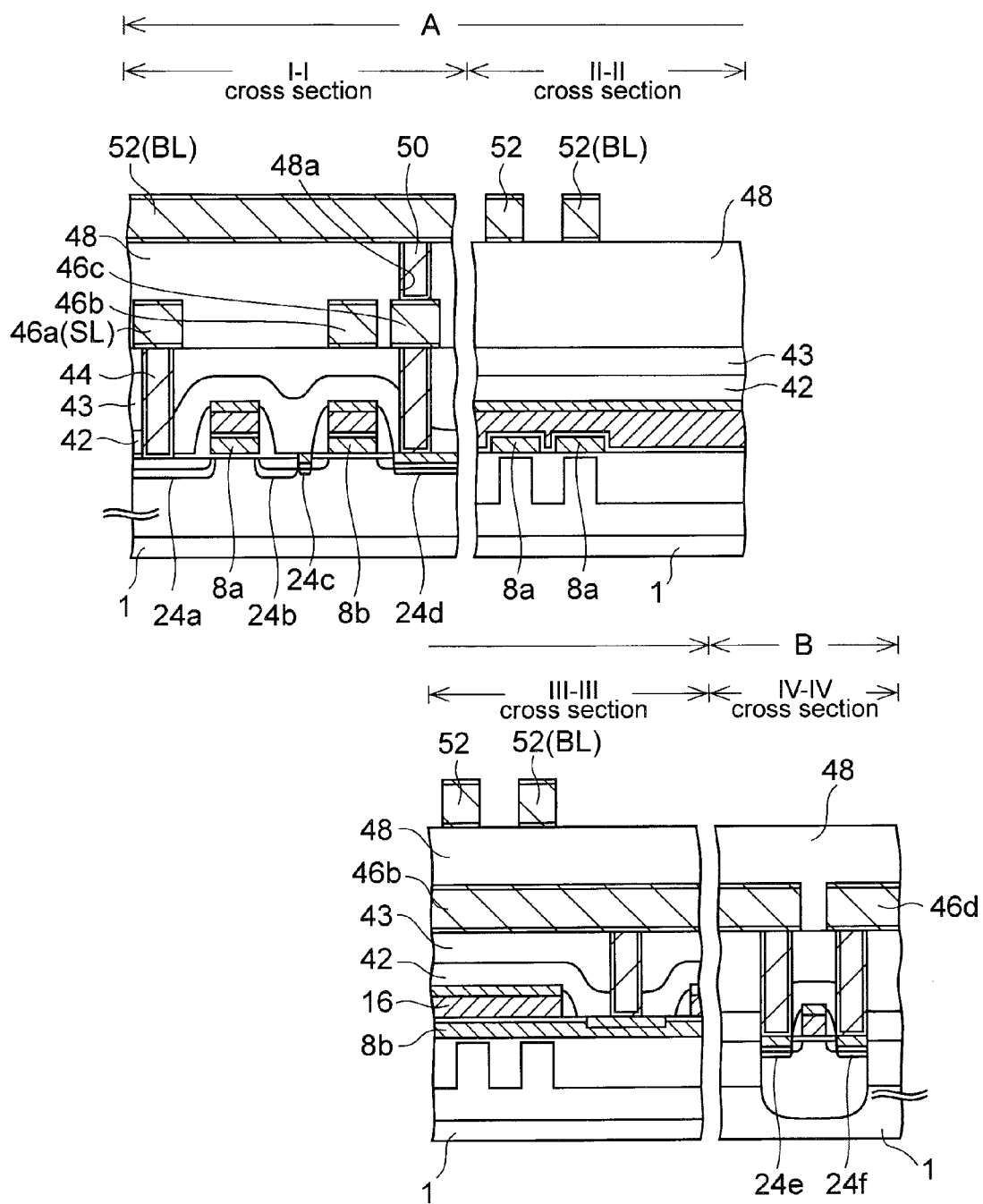

FIGS. 1A to 1V are cross-sectional views of a manufacturing semiconductor device according to the preliminary explanation, and FIGS. 2A to 2G are plan views thereof.

This semiconductor device is a logic embedded nonvolatile memory provided with a flash memory cell and a peripheral transistor. As shown in FIG. 1A, this semiconductor device has a cell region A and a peripheral circuit region B.

To manufacture the semiconductor device, as shown in FIG. 1A, device isolation grooves 1a are firstly formed in a silicon (semiconductor) substrate 1, and a device isolation insulating film 2 formed of silicon oxide film, or the like, is embedded in the divide isolation grooves 1a.

Thereafter, first and second p-wells 3 and 4 are respectively formed in the cell region A and the peripheral circuit region B.

Figure 2A:
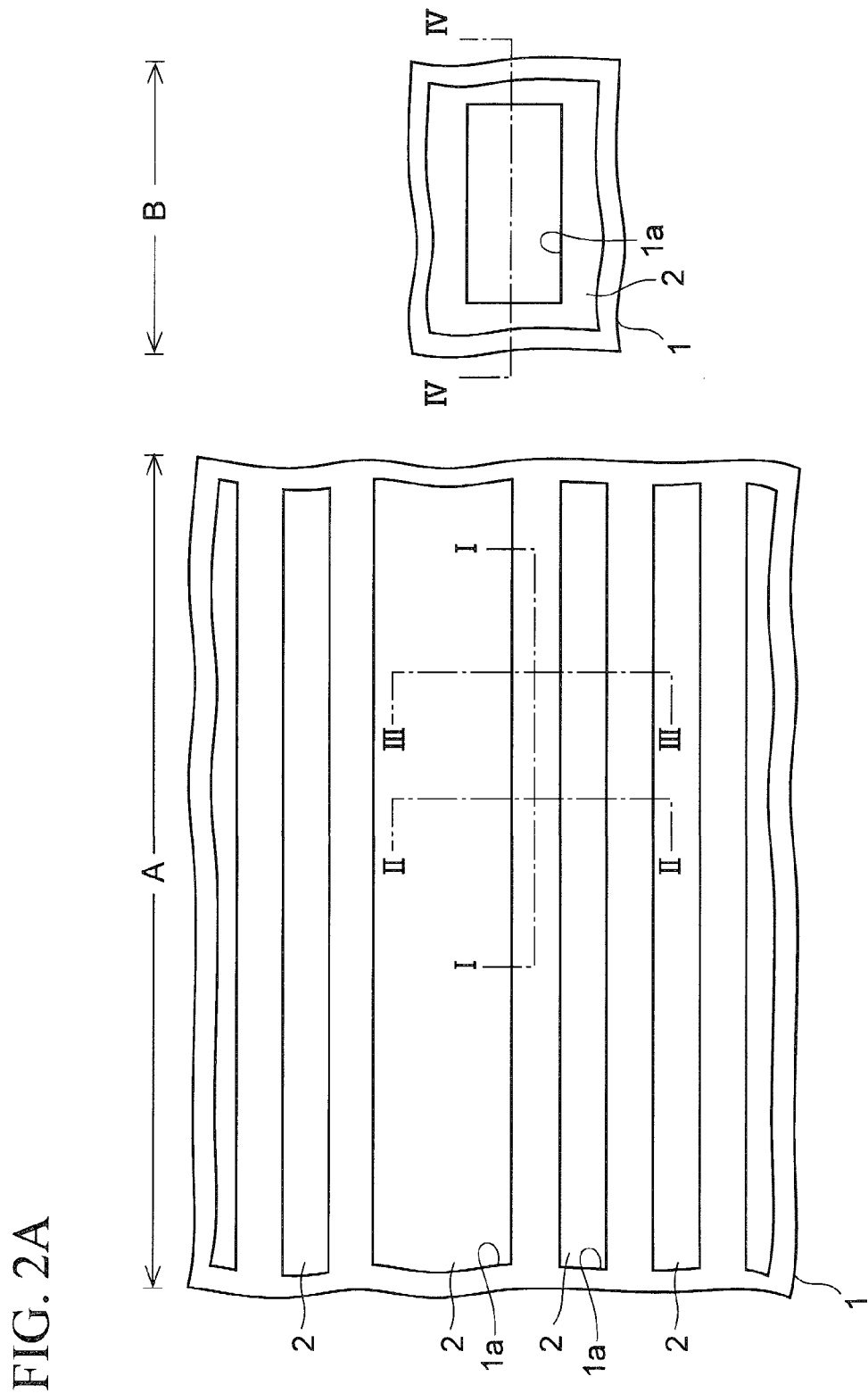
FIGS. 2A to 2G are plan views of the manufacturing semiconductor device according to the preliminary explanation.

Note that cross-sectional views in FIG. 1A correspond to those taken along the I-I, II-II, III-III, and IV-IV lines in the plan view of FIG. 2A.

Next, as shown in FIG. 1B, an entire surface of the silicon substrate 1 is thermally oxidized by heating it at the substrate temperature of approximately 800° C. in an atmosphere containing oxygen. Thereby, a tunnel insulating film 5 formed of a thermal oxidation film with the thickness of approximately 9.3 nm is formed.

Next, as shown in FIG. 1C, a doped amorphous silicon film into which phosphorus as impurities is doped is formed with the thickness of approximately 90 nm on the tunnel insulating film 5 by a chemical vapor deposition (CVD) method. The formed amorphous silicon film is used a first conductive film 8.

Next, as shown in FIG. 1D, a first resist pattern 10 is formed on the first conductive film 8. Thereafter, the first conductive film 8 is etched by using this first resist pattern 10 as a mask, so that a plurality of slit-shaped openings 8x is formed in the first conductive film 8 in the cell region A.

After that, the first resist pattern 10 is removed.

Figure 2B:
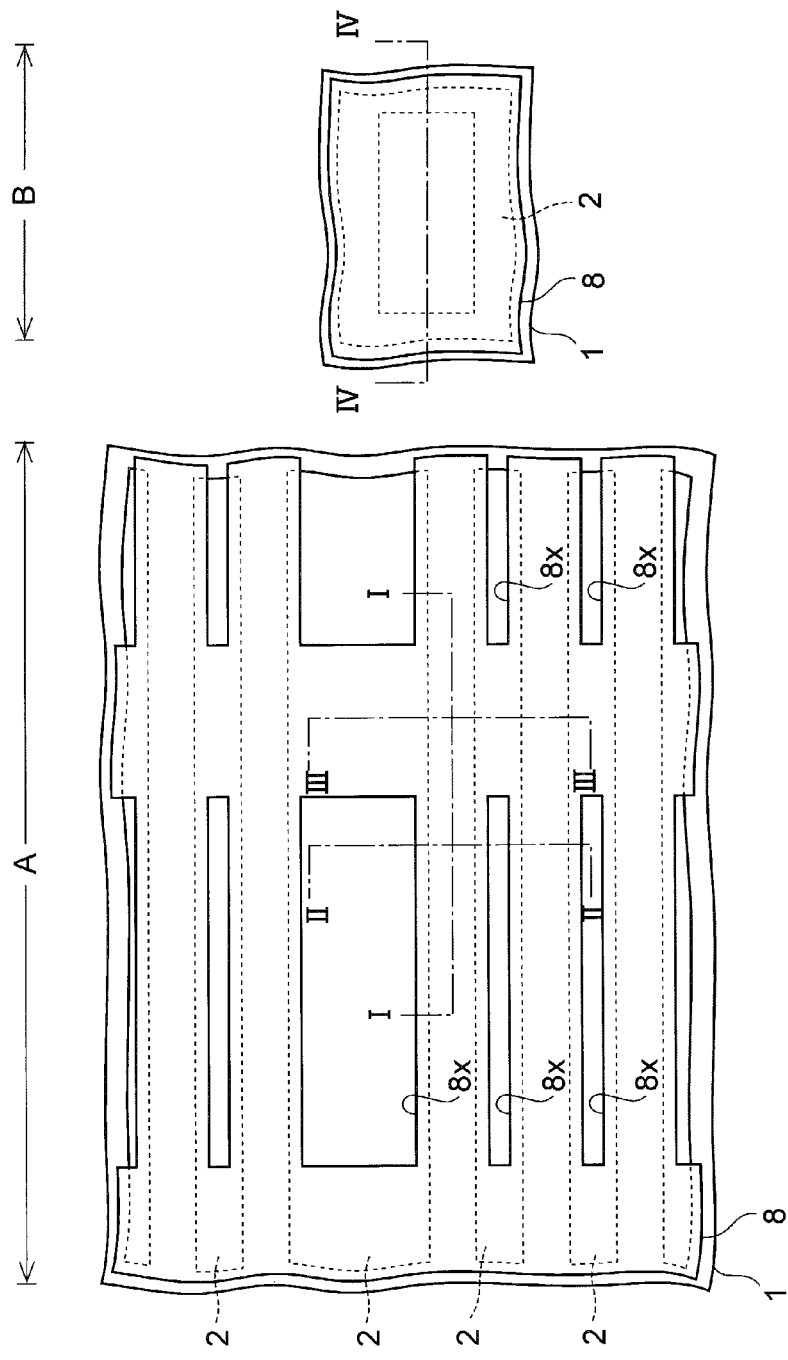

FIG. 2B is a plan view after the first resist pattern 10 is removed.

Next, as shown in FIG. 1E, an ONO film is formed as an intermediate insulating film 12 on each of the first conductive film 8 and the device isolation insulating film 2.

As shown in the dotted circle of FIG. 1E, the intermediate insulating film 12 is made by forming a first silicon oxide film 12a, a silicon nitride film 12b, and a second silicon oxide film 12c in this order.

Among these films, the first silicon oxide film 12a is formed with the thickness of approximately 10 nm on the first conductive film 8 by the CVD method at the substrate temperature of approximately 750° C. The silicon nitride film 12b is formed with the thickness of approximately 12 nm by the CVD method.

Then, the second silicon oxide film 12c in the uppermost layer is formed by thermally-oxidizing a surface layer of the silicon nitride film 12b by heating the surface thereof in the atmosphere containing oxygen at the substrate temperature of approximately 950° C. The target thickness thereof is set to be 180 nm on a surface of a test silicon substrate. However, since the oxidation of silicon nitride is less easy than silicon, the actual thickness of the second thermal oxidation film becomes approximately 5 nm.

Here, a metal oxide semiconductor (MOS) transistor for a peripheral circuit is formed later in the peripheral circuit region B. When the MOS transistor is formed, the intermediate insulating film 12 and the first conductive film 8 are unnecessary.

For this reason, as shown in FIG. 1F, in the next process, a second resist pattern 14 is formed on the intermediate insulating film 12 in the region other than the peripheral circuit region B. After that, the intermediate insulating film 12, the first conductive film 8, and the tunnel insulating film 5 in the peripheral circuit region B are removed by dry etching while this second resist pattern 14 is used as a mask.

This etching is anisotropic etching using a fluorine-based gas or a chlorine-based gas as an etching gas.

Thereafter, the second resist pattern 14 is removed.

Next, processes for obtaining a cross-sectional structure shown in FIG. 1G will be described.

Firstly, the surface of the silicon substrate 1 in the peripheral circuit region B is thermally oxidized, so as to form a gate insulating film 15 for a peripheral circuit. The gate insulating film 15 is formed of a thermal oxidation film with the thickness of approximately 7.0 nm.

Subsequently, an amorphous silicon film is formed with the thickness of approximately 120 nm on each of the intermediate insulating film 12 and the gate insulating film 15 by the CVD method. Furthermore, a tungsten silicon film is formed with the thickness of 140 nm on the amorphous silicon film by the CVD method. A laminated film of these amorphous silicon film and tungsten silicon film is used as a second conductive film 16. Note that a impurity, such as phosphorus, may be doped into amorphous silicon constituting the second conductive film 16 for a purpose of reducing resistance, at the time when the second conductive film 16 is formed.

Figure 2C:
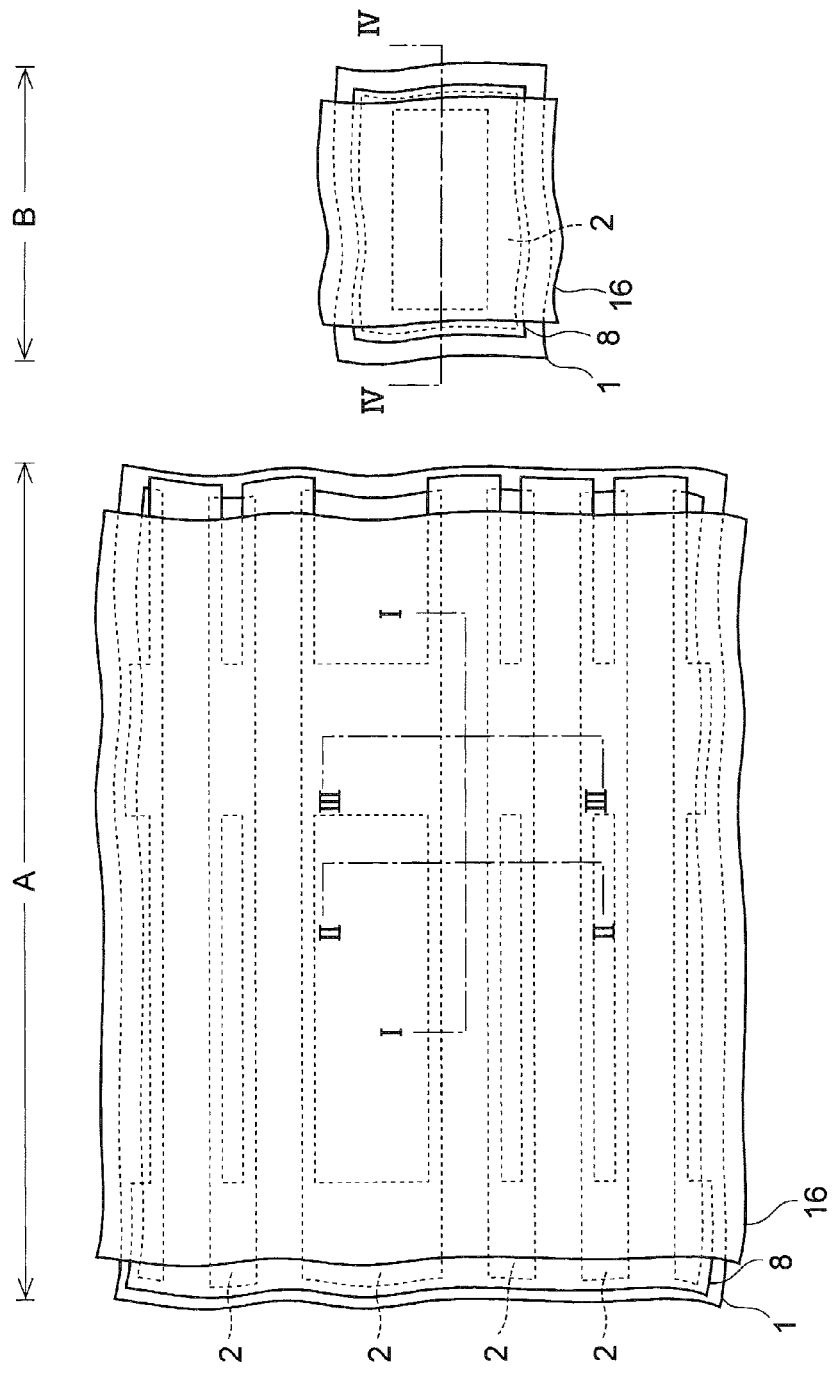

FIG. 2C is a plan view after the second conductive film 16 is formed in this manner.

Next, as shown in FIG. 1H, a third resist pattern 18 is formed on the second conductive film 16. The planar shape of the third resist pattern 18 is stripe in the cell region A. Thereafter, the first conductive film 8, the intermediate insulating film 12, and the second conductive film 16 in the cell region A are etched by using the third resist pattern 18 as a mask.

This etching is anisotropic etching using a fluorine-based gas or a chlorine-based gas as an etching gas.

Up to this steps, a flash memory cell FL made by laminating a floating gate 8a, an intermediate insulating film 12, and a control gate 16a in this order is formed in the cell region A. Among these, the control gate 16a constitutes a part of a word line (WL).

In addition, at the same time when such a flash memory cell FL is formed, a selection transistor $TR_{SEL}$, which is provided with the gate electrode 8b functioning as a selection line to be described later, is formed at a distance from the flash memory cell FL.

Similar to the floating gate 8a, the gate electrode 8b constituting the selection transistor $TR_{SEL}$ is made of the first conductive film 8, and the intermediate insulating film 12 and the second conductive film 16 remain on the gate electrode 8b. In addition, the tunnel insulating film 5 plays a role as a gate insulating film of the selection transistor $TR_{SEL}$.

Thereafter, the third resist pattern 18 is removed.

Figure 2D:
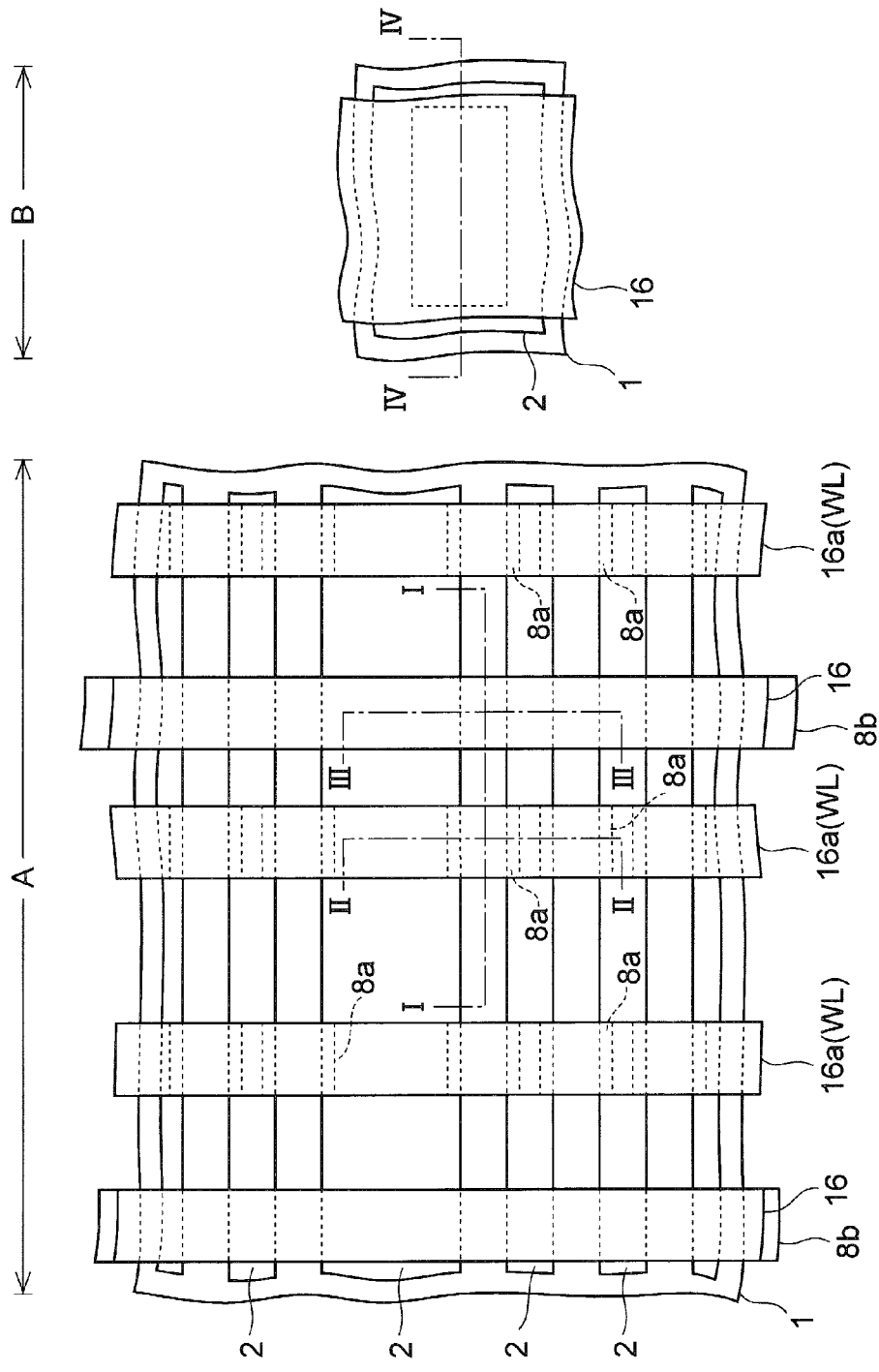

FIG. 2D is a plan view after the third resist pattern 18 is removed.

As shown in the drawing, the control gate 16a and the gate electrode 8b are formed in stripes while being parallel with each other.

Next, as shown in FIG. 1I, a fourth resist pattern 20 provided with a window 20a over the gate electrode 8b is formed on the second conductive film 16.

Subsequently, the second conductive film 16 in the cell region A is etched by using the fourth resist pattern 20 as a mask to remove the second conductive film 16 over a contact region CR of the gate electrode 8b. Thereby, an opening 16c is formed. At the same time, in the peripheral circuit region B, the second conductive film 16 is patterned into a gate electrode 16d for a peripheral circuit.

The fourth resist pattern 20 is removed after this etching is finished.

Figure 2E:
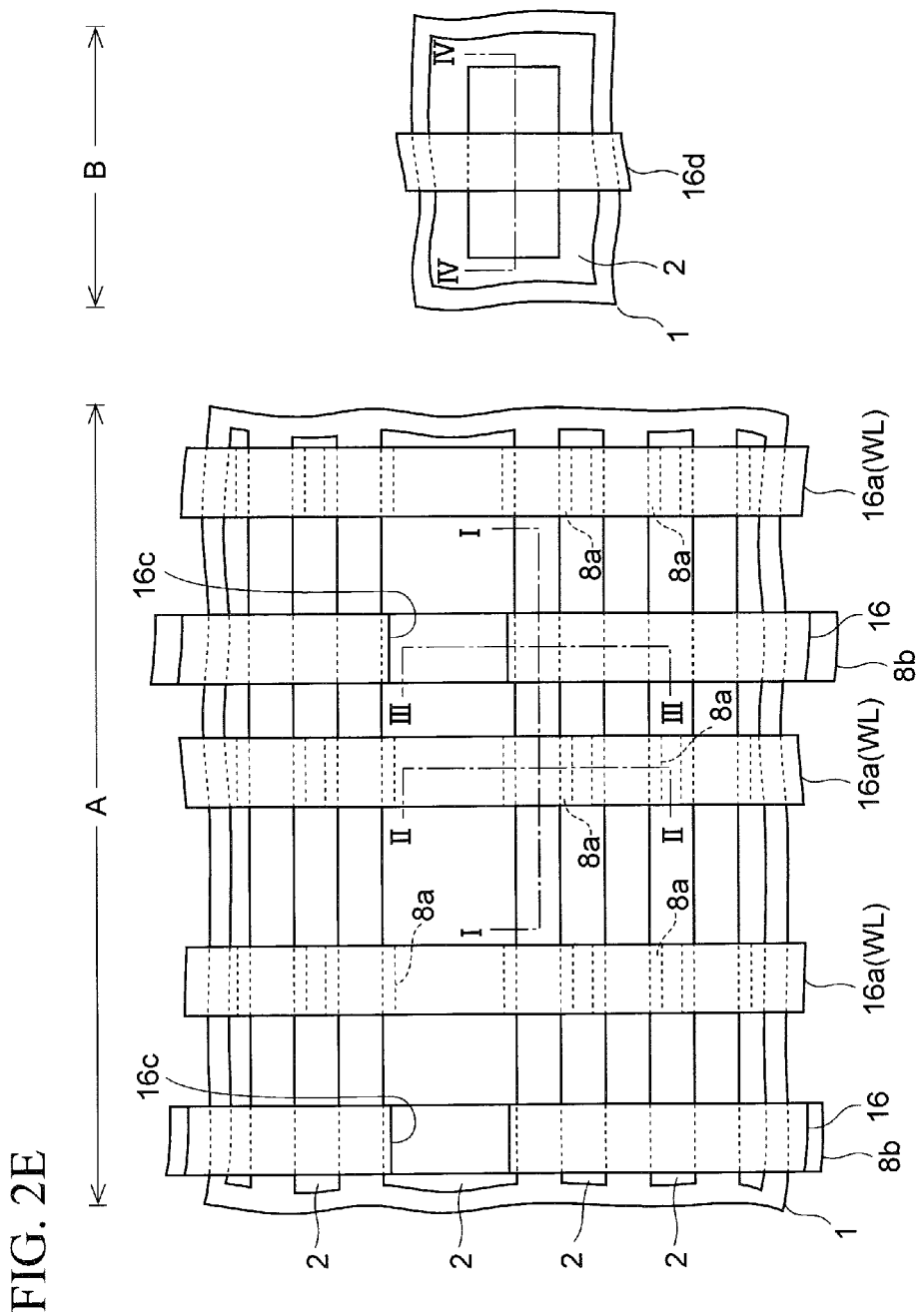

FIG. 2E is a plan view after the fourth resist pattern 20 is removed.

Next, as shown in FIG. 1J, a fifth resist pattern 22 is formed on the entire upper surface of the silicon substrate 1. Both side surfaces of the control gate 16a of the flash memory cell FL is exposed from the fifth resist pattern 22, whereas both side surfaces of the gate electrode 8b is covered with the fifth resist pattern 22.

Subsequently, while using this fifth resist pattern 22 as a mask, n-type impurities are ion-implanted into the silicon substrate 1 beside the floating gate 8a. Thereby, first and second impurity diffusion regions 24a and 24b to be source/drain regions of the flash memory cell FL are formed at a distance from each other.

This ion implantation is carried out in two steps. In the first step, phosphorus is ion-implanted under conductions with acceleration energy of 30 KeV and a dose amount of $1.0 \times 10^{14}$ cm$^{-2}$, and in the following step, arsenic is ion-implanted under conditions with acceleration energy of 25 KeV and a dose amount of $6.0 \times 10^{15}$ cm$^{-2}$.

Here, since the side surfaces of the gate electrode 8b is covered with the fifth resist pattern 22, the second impurity diffusion region 24b is formed at a distance from the gate electrode 8b.

Thereafter, the fifth resist pattern 22 is removed.

Next, as shown in FIG. 1K, phosphorus is ion-implanted as n-type impurities into the silicon substrate 1, so that first to third source/drain extensions 26a to 26c with impurity concentrations lower than those of the first and second impurity diffusion regions 24a and 24b, are formed in the cell region A. The conditions for the ion implantation are, for example, acceleration energy of 20 KeV and a dose amount of $5.0 \times 10^{13}$ cm$^{-2}$.

Next, as shown in FIG. 1L, the surfaces of the silicon substrate 1 and the floating gate 8a are thermally oxidized by heating the surfaces thereof in the atmosphere containing oxygen at the substrate temperature of 800° C. Thereby, a sacrificial thermal oxidation film is formed with the thickness of 5 nm on the silicon substrate 1.

As shown in the dotted circle in the drawing, a corner of the floating gate 8a facing the silicon substrate 1 is oxidized by forming such a sacrificial thermal oxidation film 28. Thus, the thickness of the tunnel insulating film 5 in the vicinity of the corner increases. As a result, electrons E accumulated in the floating gate 8a are made difficult to escape towards the substrate 1 along with a path P shown by the arrow in the dotted circle. Thus, the electrons E can be retained in the floating gate 8a for a long time, and retention characteristics of the flash memory cell FL is improved.

Thereafter, phosphorus is ion-implanted as n-type impurities into the silicon substrate 1 in the peripheral circuit region B under conditions with acceleration energy of 20 KeV and a dose amount of $5.0 \times 10^{13}$ cm$^{-2}$. Thereby, a fourth source/drain extension 26d is formed beside the gate electrode 16d for a peripheral circuit.

Here, in portions where the first and second impurity diffusion regions 24a and 24b are formed in the surface layer of the silicon substrate 1, an impurity concentration thereof is higher than that in other portions. For this reason, an effect of accelerating oxidation at the time of thermal oxidation is strong. As a result, the thickness of the tunnel insulating film 5 increases in the impurity diffusion regions 24a and 24b due to this thermal oxidation.

Next, as shown in FIG. 1M, a silicon oxide film is formed with the thickness of approximately 120 nm on the entire upper surface of the silicon substrate 1 by the CVD method as a sidewall insulating film 30.

Then, as shown in FIG. 1N, this sidewall insulating film 30 is etched back to be left as insulating sidewalls 30a beside the floating gate 8 and the gate electrode 8b.

An etching-back amount is set to be such a value that the tunnel insulating film 5 on the third source/drain extension 26c and the sidewall insulating film 30 is removed. Accordingly, the tunnel insulating film 5 which is thickly formed on the first and second impurity diffusion regions 24a and 24b due to the accelerating oxidation is not removed by this etching back.

Next, as shown in FIG. 1O, the entire surface of the silicon substrate 1 is thermally oxidized again by heating it in the atmosphere containing oxygen at the substrate temperature of 850° C. Thereby, a through insulating film 32 formed of a thermal oxidation film is formed with the thickness of approximately 5 nm.

Next, as shown in FIG. 1P, a sixth resist pattern 36 is formed on the entire upper surface of the silicon substrate 1 in a manner that the gate electrode 8b of the selection transistor $TR_{SEL}$ and the gate electrode 16d for a peripheral circuit expose. Then, while this sixth resist pattern 36 is used as a mask, n-type impurities are ion-implanted into the silicon substrate 1 through the through insulating film 32.

With this, third and fourth impurity diffusion regions 24c and 24d, which function as source/drain regions of the n-type selection transistor $TR_{SEL}$, are formed in the silicon substrate 1 beside the gate electrode 8b. Note that both of the impurity concentration of the third and fourth impurity diffusion regions 24c and 24d is lower than both of the impurity concentration of the first and second impurity diffusion regions 24a and 24b. Furthermore, third impurity diffusion regions 24c is formed adjacent to the second impurity diffusion regions 24b as shown in the drawing.

At the same time, fifth and sixth impurity diffusion regions 24e and 24f, which function as source/drain regions of the transistor for a peripheral circuit, are also formed in the silicon substrate 1 beside the gate electrode 16d for a peripheral circuit. As a result, an n-type peripheral transistor $TR_{PERI}$ formed of the impurity diffusion regions 24e and 24f, the gate electrode 16d, and the like, is formed in the peripheral circuit region B.

Although the conditions for this ion implantation are not particularly limited, acceleration energy of 30 KeV and a dose amount of $1.0 \times 10^{15}$ cm$^{-2}$ are used in the present embodiment.

Thereafter, the sixth resist pattern 36 is removed.

Next, as shown in FIG. 1Q, a photoresist is coated on the entire upper surface of the silicon substrate 1. Then, the photoresisit is exposed and developed to form a seventh resist pattern 39.

The seventh resist pattern 39 has a window 39a in the contract region CR of the gate electrode 8b of the selection transistor $TR_{SEL}$.

Thereafter, the intermediate insulating film 12 is removed by etching through the window 39a to expose the contact region CR of the gate electrode 8b. This etching is anisotropic etching using a fluorine-based gas as an etching gas.

Thereafter, the seventh resist pattern 39 is removed.

Then, as shown in FIG. 1R, the through insulating film 32 is removed by wet etching.

Next, processes for obtaining a cross-sectional structure shown in FIG. 1S will be described.

Firstly, a titanium film is formed with the thickness of approximately 31.5 nm on the entire upper surface of the silicon substrate 1 by the sputtering method as a refractory metal layer.

Subsequently, annealing is carried out on the refractory metal film in the nitrogen atmosphere under conditions with the substrate temperature of 700° C. and a processing time of approximately 90 seconds. With this, silicon contained in the control gate 16a and the silicon substrate 1 reacts with a refractory metal to form a metal silicide layer 40 made of titanium silicide.

Thereafter, the refractory metal film remaining unreacted on the device isolation insulating film 2 and the insulating sidewall 30a is removed by wet etching.

Then, the metal silicide layer 40 is annealed again in an argon atmosphere to lower the resistance of the metal silicide layer 40. The annealing is carried out, for example, at the substrate temperature of 800° C. for 30 seconds.

Here, as described above, the tunnel insulating film 5 is thickly left on the first and second impurity diffusion regions 24a and 24b due to the accelerating oxidation. Therefore, the tunnel insulating film 5 on the first and second impurity diffusion regions 24a and 24b prevents the reaction of silicon with the refractory metal film, so that the metal silicide layer 40 is not formed on the first and second impurity diffusion regions 24a and 24b.

Next, processes for obtaining a cross-sectional structure shown in FIG. 1T will be described.

Firstly, a silicon oxide film is formed with the thickness of approximately 100 nm on the entire upper surface of the silicon substrate 1 by the plasma CVD method as a cover insulating film 42.

Subsequently, a boro-phospho-silicate-glass (BPSG) film is formed with the thickness of 1700 nm on the cover insulating film 42 by the CVD method. This BPSG film is used as a first interlayer insulating film 43.

Thereafter, the upper surface of the first interlayer insulating film 43 is planarized by the CMP method, and then the first interlayer insulating film 43 and the cover insulating film 42 are patterned. With this, first holes 43a are formed in these insulating films over the first and fourth impurity diffusion regions 24a and 24d. In addition, a second hole 43b is formed in the insulating films 42 and 43 over the contact region CR of the gate electrode 8b, and third holes 43c are formed over the fifth and sixth impurity diffusion regions 24e and 24f in the peripheral region B.

Then, a titanium film and a titanium nitride film are formed in this order as a glue film on the inner surfaces of the first to third holes 43a to 43c and on the upper surface of the first interlayer insulating film 43 by the sputtering method. Furthermore, a tungsten film is formed on this glue film by the CVD method to completely embed the holes 43a to 43c with the tungsten film.

After that, the excessive glue film and tungsten film on the first interlayer insulating film 43 are removed, and these films are left only in the first to third holes 43a to 43c as first to third conductive plugs 44a to 44c.

Among these plugs, the first conductive plugs 44a are electrically connected to the first and fourth impurity diffusion regions 24a and 24d. In addition, the second conductive plug 44b is connected to the metal silicide layer 40 in the contact region CR of the gate electrode 8b, and is electrically connected to the gate electrode 8b through this metal silicide layer 40. Then, the third conductive plugs 44c are electrically connected to the fifth and sixth impurity diffusion regions 24e and 24f.

Figure 2F:
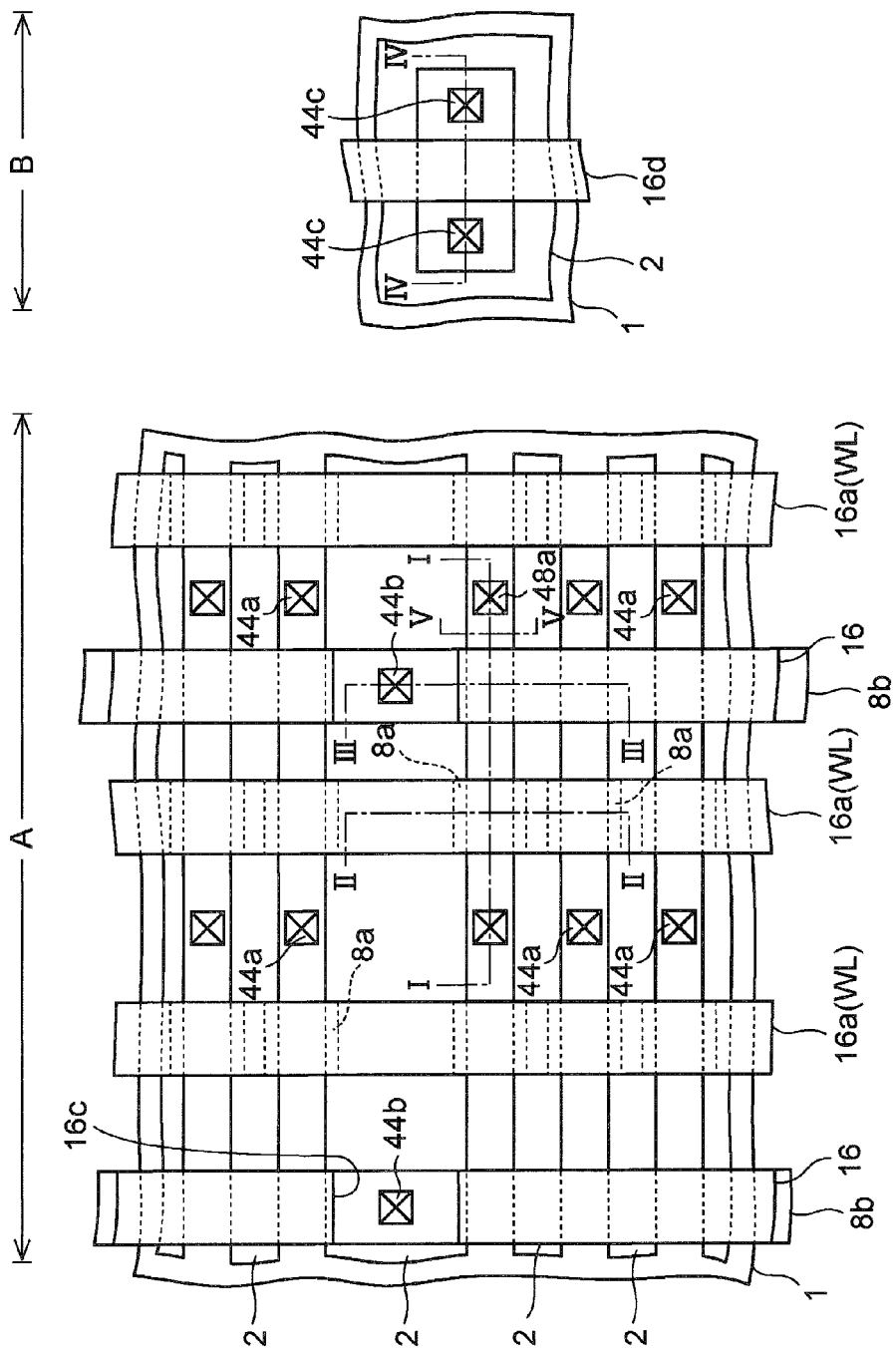

FIG. 2F is a plan view after the conductive plugs 44a to 44c are formed as described above.

Next, as shown in FIG. 1U, a metal laminated film is formed on the first interlayer insulating film 43 by the sputtering method. The metal laminated film is then patterned into a source line (SL) 46a, a selection line backing layer 46b, a bid line contact pad 46c, and a wiring 46d for a peripheral circuit. The metal laminated film is formed by laminating, for example, a titanium nitride film, a titanium film, a copper-containing aluminum film, and a titanium nitride film in this order.

Subsequently, as shown in FIG. 1V, a silicon oxide film is formed as a second interlayer insulating film 48 on the entire upper surface of the silicon substrate 1. Then, the upper surface of the second interlayer insulating film 48 is polished and planarized by the CMP method.

Furthermore, the second interlayer insulating film 48 is patterned to form a fourth hole 48a on the bit line contact pad 46c. A fifth conductive plug 50, which is electrically connected to the bid line contact pad 46c, is embedded in the fourth hole 48a by a method similar to that of the first to third conductive plugs 44a to 44c.

After that, a metal laminated film is formed on each of the upper surfaces of the fifth conductive plug 50 and the second interlayer insulating film 48 by the sputtering method. The metal laminated film is then patterned into bit lines (BL) 52.

Figure 2G:
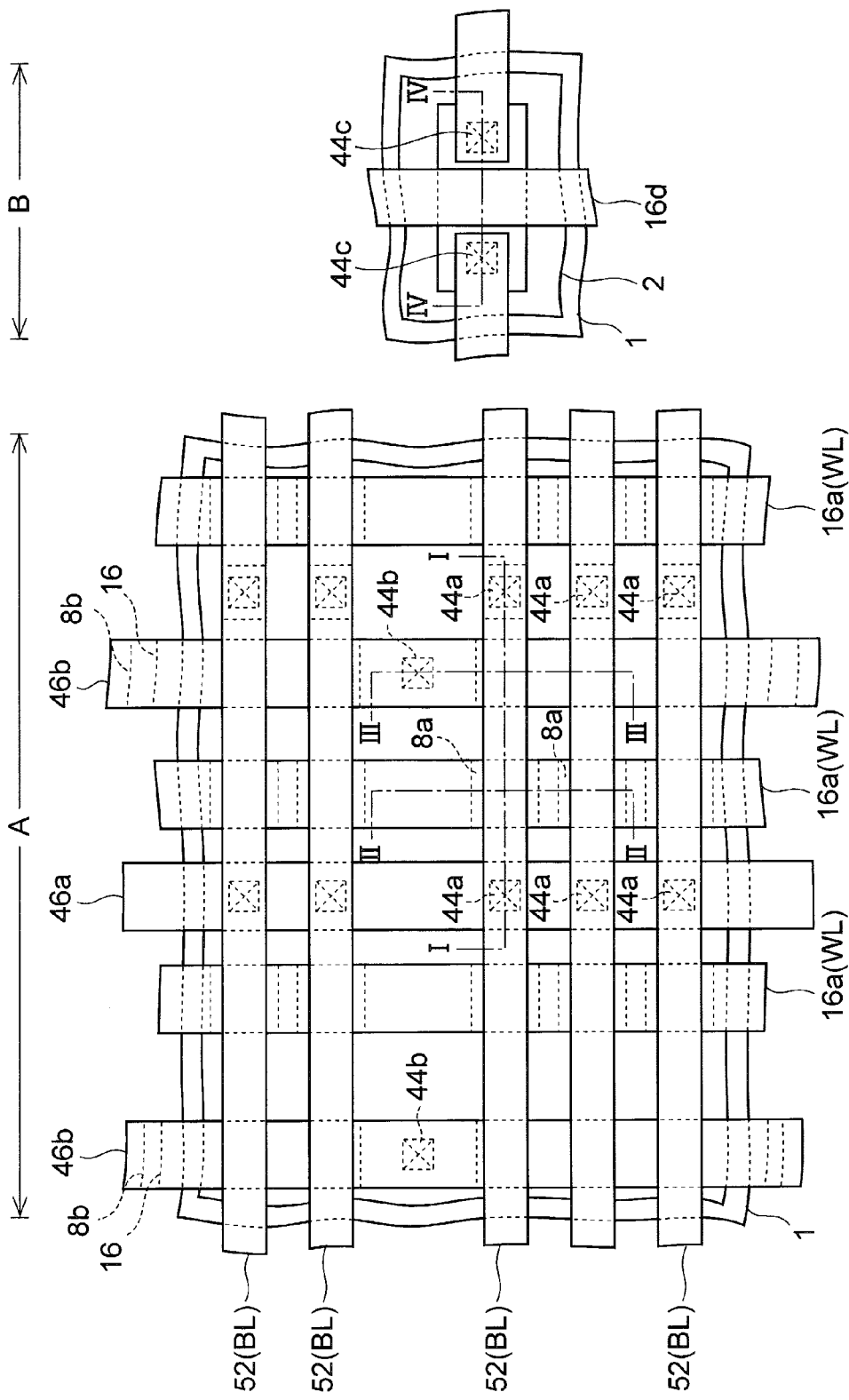

FIG. 2G is a plan view after this process is finished.

With this, a basic structure of the semiconductor device is completed.

Figure 3:
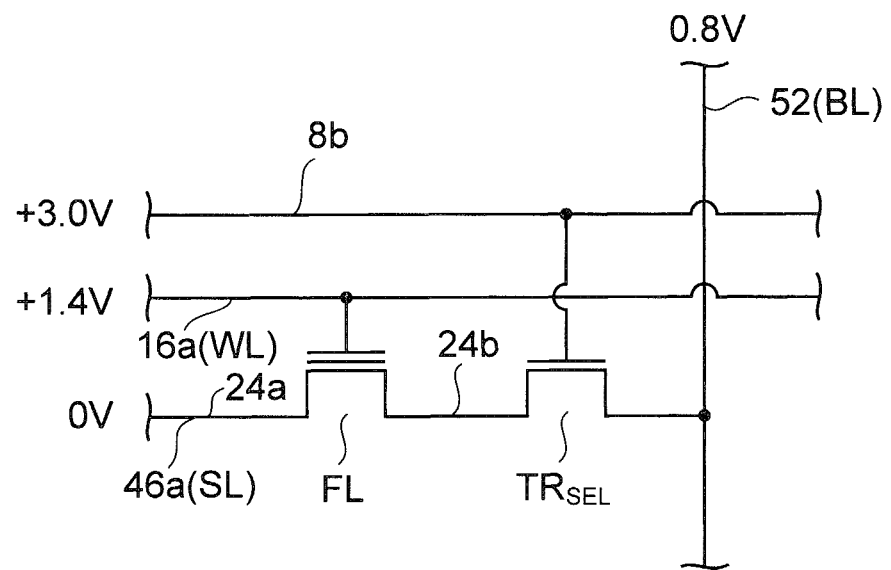
FIG. 3 is a view in which voltages applied at the time of reading out a flash memory cell are added to an equivalent circuit of the semiconductor device according to the preliminary explanation.

FIG. 3 is a view in which voltages applied at the time of reading out the flash memory cell FL are added to an equivalent circuit diagram of the semiconductor device.

As shown in the diagram, at the time of readout, a voltage of +3 V is applied to the selection line (the gate electrode) 8b to set the selection transistor $TR_{SEL}$ in an ON state. In addition, while a voltage of +1.4 V is applied to the word line (the control gate) 16a, a bias voltage (0.8 V) of the bit line 52 is applied to the source region (the second impurity diffusion region) 24b of the flash memory cell FL. Note that the source line 46a is set to be a ground potential.

Thereafter, it is determined, by an unillustrated sense circuit, whether or not a current flows between the drain region (the first impurity diffusion region) 24a and the source region (the second impurity diffusion region) 24b of the flash memory FL, so that it is read out whether or not information (holes) is written in the floating gate 8a of the flash memory cell FL.

Figure 4:
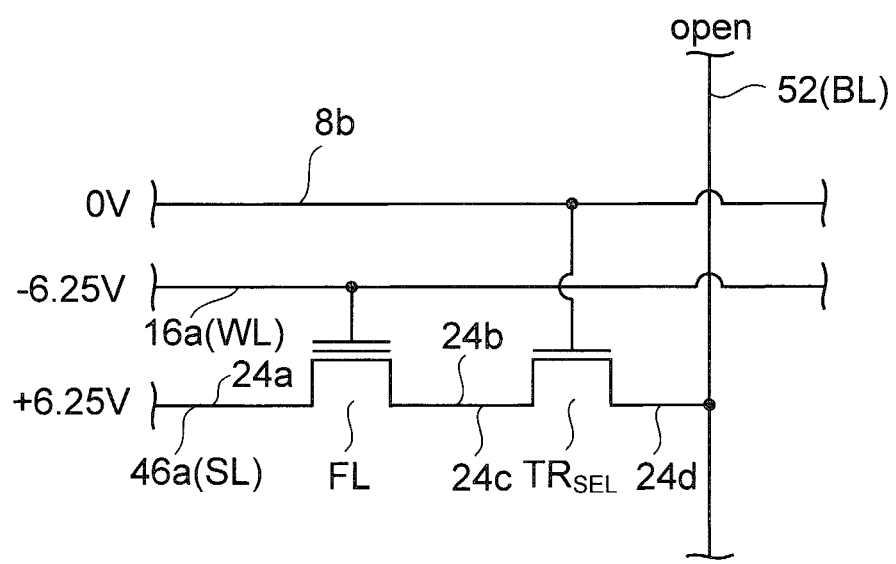
FIG. 4 is a view in which voltages applied at the time of carrying out writing to the flash memory cell are added to the equivalent circuit of the semiconductor device according to the preliminary explanation.

In contrast, FIG. 4 is a view in which voltages applied at the time of carrying out writing to the flash memory cell FL is added to the above-described equivalent circuit diagram.

As shown in the diagram, at the time of writing, the selection line 8b is set to be a ground potential to set the selection transistor $TR_{SEL}$ in an OFF state, and the bit line 52 is set to be a floating potential. Furthermore, a positive voltage of +6.25 V is applied to the source line 46a, and a negative voltage of −6.25 V is applied to the control gate 16a, so that holes (information) are accumulated in the floating gate 8a.

Here, in the semiconductor device having such an equivalent circuit structure as described above, if impurity concentrations of the source/drain regions of each of the flash memory cell FL and the selection transistor $TR_{SEL}$ were set to be equal, the following disadvantages would be caused.

Firstly, with regard to the flash memory cell FL, impurity concentrations of the source/drain regions (the first and second impurity diffusion regions) 24a and 24b becomes lower than that necessary for facilitating the wiring operation. Thus, it becomes difficult to perform the wiring operation to the flash memory cell FL.

With regard to the selection transistor $TR_{SEL}$, impurity concentrations of the source/drain regions (the third and fourth impurity diffusion regions) 24c and 24c becomes undesirably increases, which in turn makes the gradient of a p-n junction at the interface between the p-type first well 3 and the regions 24c and 24d steeper. Thus, junction leak increases between the substrate and the source/drain regions.

To avoid such disadvantages, in a semiconductor device of this type, the impurity concentrations of the first and second impurity diffusion regions 24a and 24b, which serve as the source/drain regions of the flash memory cell FL, are set to be higher than those of the third and fourth impurity diffusion regions 24c and 24d, which serves as the source/drain regions of the selection transistor $TR_{SEL}$.

However, when the regions 24a to 24d with different impurity concentrations are present in the surface layer of the silicon substrate 1 in this manner, the tunnel insulating film 5 grows thickly on the first impurity diffusion region 24a with the high impurity concentration due to the accelerating oxidation, in the step (FIG. 1L) of thermal oxidation for increasing the retention characteristics.

The sacrificial thermal oxidation film 28 is left on the first impurity diffusion region 24a even after the etching steps of FIGS. 1N and 1R are carried out, which, as a consequence, prevents the formation of the metal silicide layer 40 (see, FIG. 1S) as described above.

As a result, the first conductive plug 44a on the first impurity diffusion region 24a (see, FIG. 1T) comes in direct contact with the first impurity diffusion region 24a without having the metal silicide layer 40 therebetween. For this reason, a problem arises that contact resistance of the first conductive plug 44a increases.

To avoid such a problem, it is possibly considered that in the etching steps of FIGS. 1N and 1R, the etching-back is further carried out until the tunnel insulating film 5 on the first impurity diffusion region 24a is removed.

Figure 5:
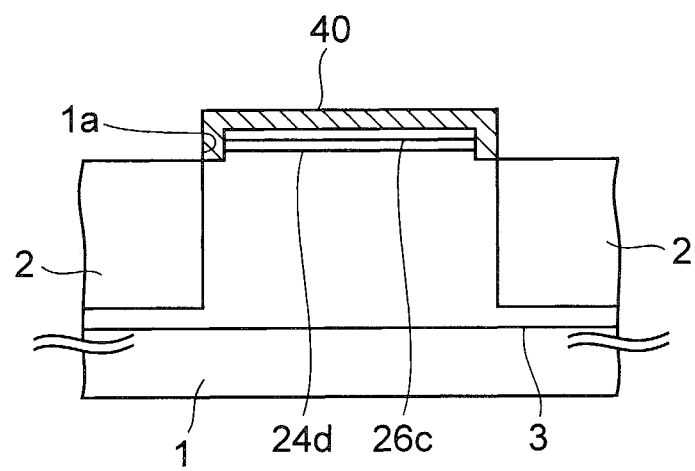
FIG. 5 is a cross-sectional view for describing disadvantages caused when a device isolation insulating film is etched in the preliminary explanation.

FIG. 5 is an enlarged cross-sectional view of an essential portion in the vicinity of the selection transistor $TR_{SEL}$ in the case where such an etching is carried out. Note that this cross-sectional view corresponds to that taken along the V-V line in FIG. 2F. As shown in the drawing, when the etching-back is carried out so that the thick sacrificial thermal oxidation film 28 on the first impurity diffusion region 24a is removed, the device isolation insulating film 2 beside the selection transistor $TR_{SEL}$ is also etched. As a result, the upper surface of the device isolation insulating film 2 becomes lower than the fourth impurity diffusion region 24d.

When the device isolation insulating film 2 has such a low upper surface, the metal silicide layer 40 is also formed in the device isolation groove 1a. As a result, such an another problem arises that the first conductive plug 44a on the fourth impurity diffusion region 24d and the first p-well 3 cause an electrical short circuit due to the metal silicide layer 40.

In view of the forgoing description, the inventor of the present application comes up with the following embodiments.

(2) Description of the Present Embodiment

Figure 6A:
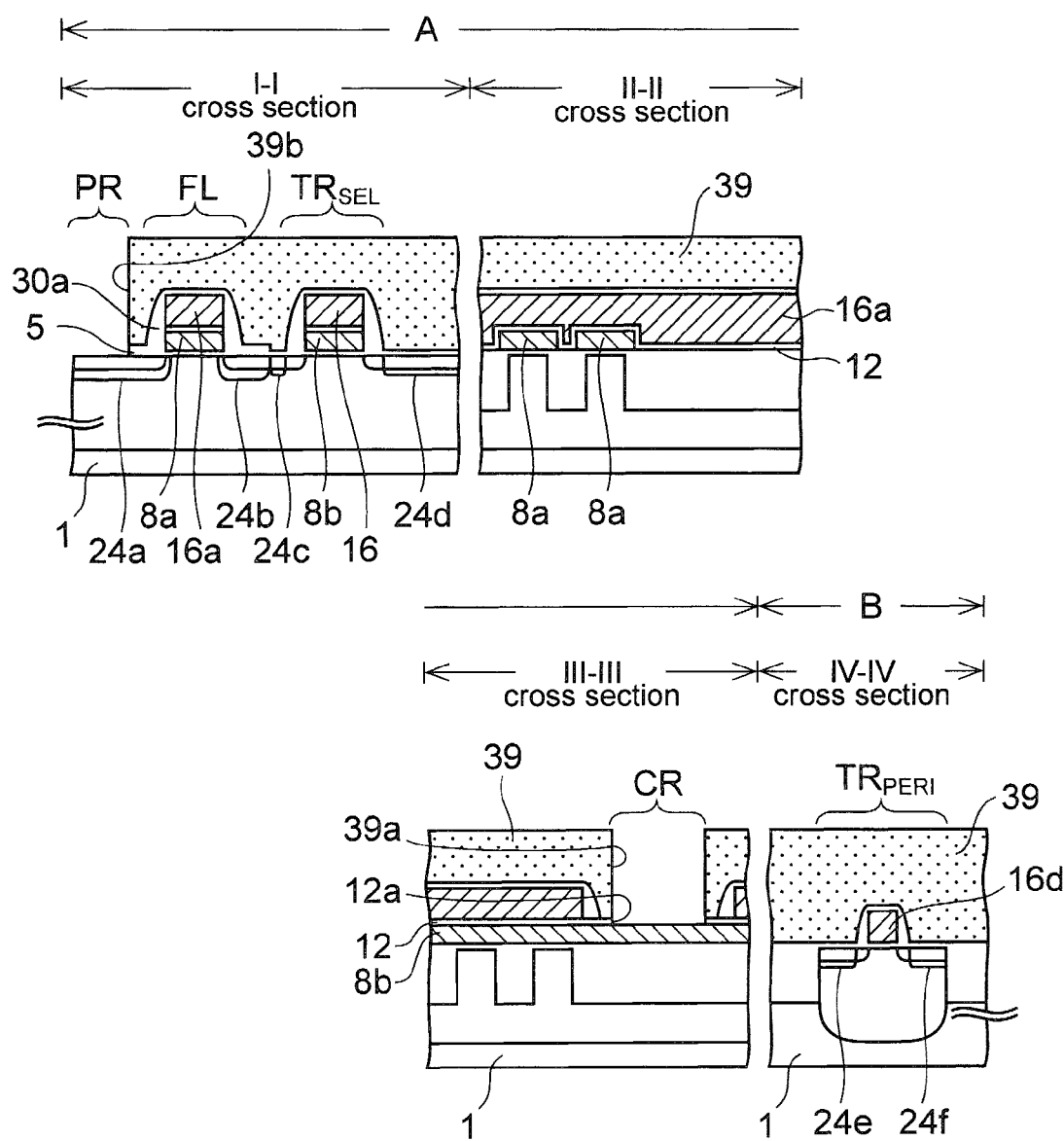
FIGS. 6A to 6C are cross-sectional views showing a manufacturing semiconductor device according to an embodiment.
Figure 6B:
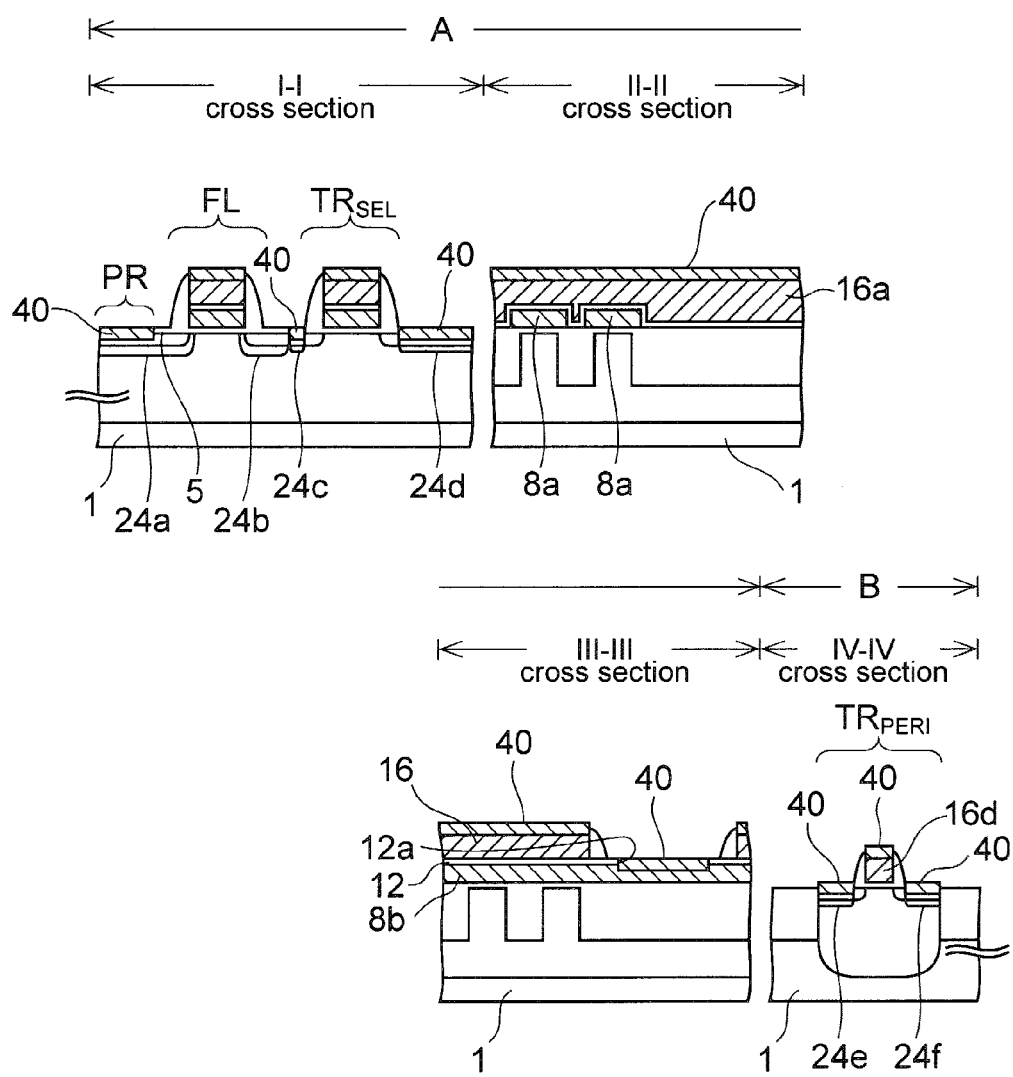
Figure 6C:
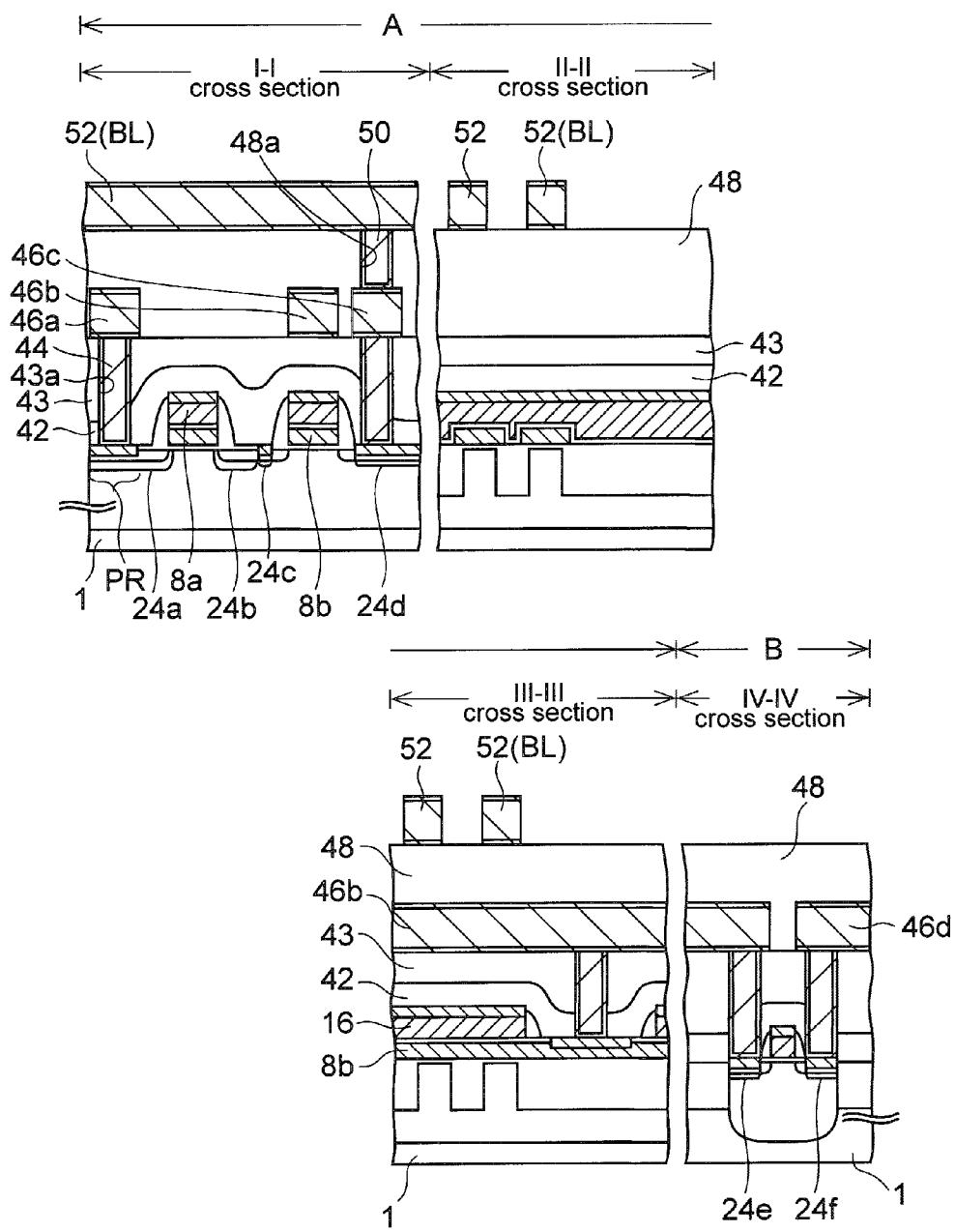

FIGS. 6A to 6C are cross-sectional views of a semiconductor device according to the present embodiment in the course of manufacturing.

In order to manufacture this semiconductor device, the above-described processes of FIGS. 1A to 1P are firstly carried out.

Next, as shown in FIG. 6A, the seventh resist pattern 39 described in FIG. 1Q is formed on each of the tunnel insulating film 5 and the flash memory cell FL.

The seventh resist pattern 39 has a window 39a over the contact region CR of the gate electrode 8b, and has a window 39b over a partial region PR of the first impurity diffusion region 24a.

After that, in the partial region PR of the first impurity diffusion region 24a, the tunnel insulating film 5, which is thickly formed due to the accelerating oxidation as described above, is removed by etching through the window 39b. At the same time, the intermediate insulating film 12 is removed by etching through the window 39a over the contact region CR of the gate electrode 8b.

As described by referring to FIG. 1Q, this etching is anisotropic etching using a fluorine-based gas as an etching gas.

Note that the window 39b of the seventh resist pattern 39 is displaced from the insulating sidewall 30a beside the floating gate 8a. Accordingly, the tunnel insulating film 5 between the insulating sidewall 30a and the partial region PR is covered by the seventh resist pattern 39, and is left without being etched.

The seventh resist pattern 39 is removed after this etching is finished.

Next, as shown in FIG. 6B, by carrying out the same processes as those of FIGS. 1R and 1S, a metal silicide layer 40 made of titanium silicide is formed on the first to sixth impurity diffusion regions 24a to 24f.

Here, since the tunnel insulating film 5 in the partial region PR of the first impurity diffusion region 24a is removed in the previous step, the above-described metal silicide layer 40 is also formed in the partial region PR.

Thereafter, a basic structure of the semiconductor device according to the present embodiment as shown in FIG. 6C is completed by carrying out the above-described processes of FIGS. 1T to 1V.

A method for reading out and writing information to the flash memory cell FL provided in the semiconductor device is similar to that described in FIGS. 3 and 4, and hence, the description thereof will be omitted.

According to the above-described present embodiment, the tunnel insulating film 5, which is thickly formed in the partial region PR of the first impurity diffusion region 24a due to the accelerating oxidation, is removed in the step of FIG. 6A. Thus, the metal silicide layer 40 can be also formed in the partial region PR.

Hence, the first plug 44a (see, FIG. 6C) over the first impurity diffusion region 24a is connected to the metal silicide layer 40, so that the contact resistance of the first conductive plug 44a can be lowered.

Such an advantage can be particularly easily obtained in the case, as in the present embodiment, where the first to fourth impurity diffusion regions 24a to 24d with different impurity concentrations are formed. In this case, the tunnel insulating film 5 has different film thicknesses on the first to fourth impurity diffusion regions 24a to 24d by carrying out the step of thermal oxidation (FIG. 1L) for improving the retention characteristics as described above.

Furthermore, as described above, the step (FIG. 6A) of removing the unnecessary intermediate insulating film 12 in the contact region CR of the gate electrode 8b plays the role of removing the tunnel insulating film 5 in the partial region PR. Therefore, an increase in the number of processes can be avoided.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device, comprising:
   a semiconductor substrate;
   a first impurity diffusion region and a second impurity diffusion region, which are formed at a distance from each other in the semiconductor substrate;
   a third impurity diffusion region and a fourth impurity diffusion region, which are formed at a distance from each other in the semiconductor substrate, and which have impurity concentrations lower than those of the first and second impurity diffusion regions, and the third impurity diffusion region which is formed adjacently to the second impurity diffusion region;
   a first thermal oxidation film formed on a part of the first impurity diffusion region and covering the second impurity diffusion region, and a second thermal oxidation film formed on the semiconductor substrate between the third and fourth impurity diffusion regions;
   a flash memory cell including a floating gate formed of a first conductive film formed on the first thermal oxidation film, an intermediate insulating film, and a control gate formed of a second conductive film, and the first and second impurity diffusion regions are source/drain regions of the flash memory cell;
   an insulating sidewall formed beside the floating gate;
   a MOS transistor including a gate electrode formed on the second thermal oxidation film, and the third and fourth impurity diffusion regions are source/drain regions of the MOS transistor;
   a first metal silicide layer formed on a second part of the first impurity diffusion region, a second metal silicide layer on the fourth impurity diffusion region, and a fourth metal silicide layer formed on the third impurity diffusion region;
   an interlayer insulating film which covers the flash memory cell and the MOS transistor; and
   a first conductive plug formed in the interlayer insulating film and reaching the first metal silicide layer,
   wherein a part of an upper surface of the first thermal oxidation film contacts with the interlayer insulating film.

2. The semiconductor device according to claim 1, wherein the gate electrode is formed of the first conductive film.

3. The semiconductor device according to claim 1, wherein
   the first to fourth impurity diffusion regions have the same conductive type, and
   the MOS transistor functions as a selection transistor for the flash memory cell.

4. The semiconductor device according to claim 1, wherein,
   on an upper surface of the gate electrode in a portion other than a contact region, the intermediate insulating film and the second conductive film are formed in this order, and
   a second conductive plug, which is electrically connected to the gate electrode, is formed in the interlayer insulating film.

5. The semiconductor device according to claim 4, further comprising
   a third metal silicide layer is formed also on the upper surface of the gate electrode in the contact region, wherein
   the third metal silicide layer and the second conductive plug are connected.

6. The semiconductor device according to claim 1, wherein the first and second conductive films are formed of a polysilicon film, and the intermediate insulating film is formed of an ONO film.

* * * * *